US012757629B2

(12) United States Patent
Lim et al.

(10) Patent No.: US 12,757,629 B2
(45) Date of Patent: Oct. 6, 2026

(54) PEROVSKITE PHOTODIODE AND IMAGE SENSOR AND ELECTRONIC DEVICE

(71) Applicants: Samsung Electronics Co., Ltd., Suwon-si (KR); IUCF-HYU (Industry-University Cooperation Foundation Hanyang University), Seoul (KR)

(72) Inventors: Seon-Jeong Lim, Suwon-si (KR); Hui Joon Park, Seoul (KR); In Kim, Suwon-si (KR); Han Sol Park, Seoul (KR); Jihyeon Heo, Seoul (KR); Hyerim Hong, Suwon-si (KR)

(73) Assignees: Samsung Electronics Co., Ltd., Gyeonggi-do (KR); IUCF-HYU (Industry-University Cooperation Foundation Hanyang University), Seoul (KR)

( * ) Notice: Subject to any disclaimer, the term of this patent is extended or adjusted under 35 U.S.C. 154(b) by 544 days.

(21) Appl. No.: 18/478,535

(22) Filed: Sep. 29, 2023

(65) Prior Publication Data

US 2024/0224547 A1 Jul. 4, 2024

(30) Foreign Application Priority Data

Dec. 23, 2022 (KR) ........................ 10-2022-0183372

(51) Int. Cl.
*H10K 85/50* (2023.01)
*H10K 30/10* (2023.01)
(Continued)

(52) U.S. Cl.
CPC ............ *H10K 85/50* (2023.02); *H10K 30/10* (2023.02); *H10K 39/32* (2023.02); *H10K 85/615* (2023.02); *H10K 85/6572* (2023.02)

(58) Field of Classification Search
CPC ........ H10K 30/10; H10K 39/32; H10K 85/50; H10K 85/615; H10K 85/6572
See application file for complete search history.

(56) References Cited

U.S. PATENT DOCUMENTS

| | | | | |
|---|---|---|---|---|
| 9,548,336 B2 * | 1/2017 | Kim | ....................... | H10K 39/32 |
| 2015/0318511 A1 * | 11/2015 | Kim | ..................... | H10K 50/121 257/40 |

(Continued)

FOREIGN PATENT DOCUMENTS

| | | |
|---|---|---|
| CN | 113185449 A | 7/2021 |
| CN | 109836369 B | 6/2022 |

(Continued)

*Primary Examiner* — Golam Mowla
(74) *Attorney, Agent, or Firm* — Harness, Dickey & Pierce, P.L.C.

(57) ABSTRACT

A perovskite photodiode includes a first electrode and a second electrode, and a perovskite photoelectric conversion layer between the first electrode and the second electrode and including a Pb-free perovskite, and an auxiliary layer between the first electrode and the perovskite photoelectric conversion layer, and including a compound represented by Chemical Formula 1.

[Chemical Formula 1]

(Continued)

In Chemical Formula 1, $X^1$, $X^2$ and $R^1$ to $R^6$ are as defined in the specification.

19 Claims, 10 Drawing Sheets

(51) Int. Cl.
*H10K 39/32* (2026.01)
*H10K 85/60* (2023.01)

(56) References Cited

U.S. PATENT DOCUMENTS

| | | | | |
|---|---|---|---|---|
| 2016/0380204 | A1 | 12/2016 | Song et al. | |
| 2020/0185630 | A1* | 6/2020 | Ke | H10K 85/50 |
| 2023/0030824 | A1 | 2/2023 | Lim et al. | |
| 2023/0105575 | A1 | 4/2023 | Hong et al. | |

FOREIGN PATENT DOCUMENTS

| | | | |
|---|---|---|---|
| CN | 114805324 | A | 7/2022 |
| EP | 03065190 | A1 | 9/2016 |
| JP | 6850435 | B2 | 3/2021 |
| KR | 101688222 | B1 | 12/2016 |
| KR | 2020-0132336 | A | 11/2020 |

* cited by examiner

PEROVSKITE PHOTODIODE AND IMAGE SENSOR AND ELECTRONIC DEVICE

CROSS-REFERENCE TO RELATED APPLICATION

This application claims priority to and the benefit of Korean Patent Application No. 10-2022-0183372 filed in the Korean Intellectual Property Office on Dec. 23, 2022, the entire contents of which are incorporated herein by reference.

BACKGROUND

1. Field

Perovskite photodiodes, image sensors, and electronic devices are disclosed.

2. Description of the Related Art

An imaging device such as a camera includes an imaging device that captures an image and stores the captured image as an electrical signal. The imaging device includes an image sensor that decomposes incident light according to a wavelength to convert each component into an electrical signal. Currently commercialized image sensors are mainly crystalline silicon-based image sensors.

SUMMARY

However, since crystalline silicon has a light absorption characteristic of a wide-ranged wavelength spectrum of about 200 nm to about 1400 nm, it is difficult to implement wavelength selectivity and there are limitations in the process. Accordingly, a photodiode capable of replacing crystalline silicon and being applied to an image sensor is being studied.

Some example embodiments provide a perovskite photodiode capable of increasing wavelength selectivity, widening process selectivity, and improving electrical characteristics with a simple structure.

Some example embodiments provide an image sensor including the perovskite photodiode.

Some example embodiments provide an electronic device including the perovskite photodiode or the image sensor.

According to some example embodiments, a perovskite photodiode includes a first electrode and a second electrode, a perovskite photoelectric conversion layer between the first electrode and the second electrode, the perovskite photoelectric conversion layer including a Pb-free perovskite, and an auxiliary layer between the first electrode and the perovskite photoelectric conversion layer, the auxiliary layer including a compound represented by Chemical Formula 1.

[Chemical Formula 1]

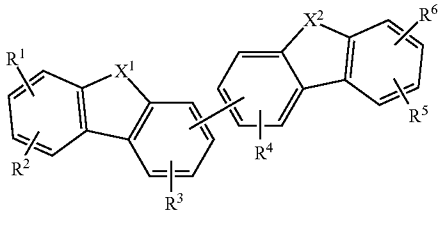

In Chemical Formula 1, $X^1$ and $X^2$ are different from each other and each is $CR^aR^b$, $SiR^cR^d$, or $NR^e$, $R^1$ to $R^6$ are each independently hydrogen, a substituted or unsubstituted C1 to C30 alkyl group, a substituted or unsubstituted C1 to C30 alkoxy group, a substituted or unsubstituted C6 to C20 aryl group, a substituted or unsubstituted C3 to C20 heterocyclic group, a halogen, a cyano group, —$NR^fR^g$, or any combination thereof, at least one of $R^1$ or $R^6$ is a substituted or unsubstituted C6 to C20 aryl group, a substituted or unsubstituted C3 to C20 heterocyclic group, —$NR^fR^g$, or any combination thereof, $R^a$ to $R^g$ are each independently hydrogen, a substituted or unsubstituted C1 to C30 alkyl group, a substituted or unsubstituted C6 to C20 aryl group, a substituted or unsubstituted C3 to C20 heterocyclic group, a halogen, a cyano group, or any combination thereof, $R^a$ and $R^b$ are each independently present or are combined with each other to form a first ring, $R^c$ and $R^d$ are each independently present or are combined with each other to form a second ring, and $R^f$ and $R^g$ are each independently present or are combined with each other to form a third ring.

The Pb-free perovskite may include organic-inorganic tin halide perovskite represented by Chemical Formula 2.

[Chemical Formula 2]

$$FA_{1-a}X_aSnI_3$$

In Chemical Formula 2,

FA is formamidinium,

X is ethylene diammonium, methyl ammonium, $Cs^+$, substituted or unsubstituted C6 to C12 aromatic alkyl ammonium, substituted or unsubstituted C1 to C10 aliphatic ammonium, or any combination thereof, and $$0 \leq a \leq 1.$$

$X^1$ in Chemical Formula 1 may be $CR^aR^b$ or $SiR^cR^d$, where $R^a$ to $R^d$ may each independently be hydrogen, a substituted or unsubstituted C1 to C30 alkyl group, or a substituted or unsubstituted C6 to C20 aryl group, and $X^2$ in Chemical Formula 1 may be $NR^e$, wherein $R^e$ may be a substituted or unsubstituted C6 to C20 aryl group.

$R^1$ and $R^6$ in Chemical Formula 1 may each be —$NR^fR^g$, where $R^f$ and $R^g$ may each be a substituted or unsubstituted C6 to C20 aryl group, or $R^f$ and $R^g$ may be bonded through a single bond, substituted or unsubstituted C1 to C5 alkylene group, a substituted or unsubstituted C2 to C5 alkenylene group, a substituted or unsubstituted C6 to C20 arylene group, O, S, Se, Te, $CR^hR^i$, $SiR^jR^k$, or $GeR^lR^m$ to form a separate ring, wherein $R^h$ to $R^m$ are each independently hydrogen, a substituted or unsubstituted C1 to C30 alkyl group, a substituted or unsubstituted C6 to C20 aryl group, a substituted or unsubstituted C3 to C20 heterocyclic group, a halogen, a cyano group, or any combination thereof.

The compound may be represented by Chemical Formula 1A.

[Chemical Formula 1A]

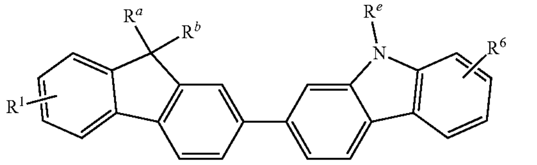

In Chemical Formula 1 A, $R^a$ and $R^b$ are each independently hydrogen, a substituted or unsubstituted C1 to C30 alkyl group or a substituted or unsubstituted C6 to C20 aryl group, $R^e$ is a substituted or unsubstituted C6 to C20 aryl group, and $R^1$ and $R^6$ are each one of the plurality of groups listed in Group 1,

[Group 1]

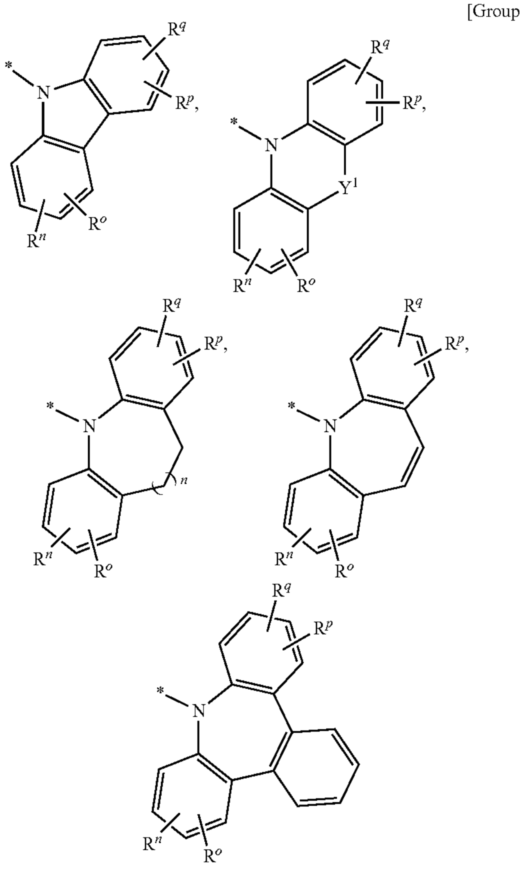

In Group 1, $Y^1$ is O, S, Se, Te, $CR^hR^i$, $SiR^jR^k$, or $GeR^lR^m$, $R^h$ to $R^q$ are each independently hydrogen, a substituted or unsubstituted C1 to C30 alkyl group, a substituted or unsubstituted C6 to C20 aryl group, a substituted or unsubstituted C3 to C20 heterocyclic group, a halogen, a cyano group, or any combination thereof, n is an integer from 0 to 2, and

* is a linking point with Chemical Formula 1 A.

According to some example embodiments, an image sensor including the perovskite photodiode is provided.

According to some example embodiments, an image sensor includes a substrate, a first perovskite photodiode on the substrate, and a wavelength selective filter layer overlapped with the first perovskite photodiode and including a plurality of wavelength selective filters, wherein the first perovskite photodiode includes a first electrode and a second electrode, a first perovskite photoelectric conversion layer between the first electrode and the second electrode and including a first Pb-free perovskite, and a first auxiliary layer between the first electrode and the first perovskite photoelectric conversion layer and including the compound represented by the Chemical Formula 1.

The first Pb-free perovskite may include the organic-inorganic tin halide perovskite represented by the Chemical Formula 2.

$X^1$ in Chemical Formula 1 may be $CR^aR^b$ or $SiR^cR^d$, wherein $R^a$ to $R^d$ are each independently hydrogen, a substituted or unsubstituted C1 to C30 alkyl group or a substituted or unsubstituted C6 to C20 aryl group, $X^2$ in Chemical Formula 1 may be $NR^e$, wherein $R^e$ is a substituted or unsubstituted C6 to C20 aryl group, and $R^1$ and $R^6$ in Chemical Formula 1 may each be —$NR^fR^g$, wherein $R^f$ and $R^g$ are each a substituted or unsubstituted C6 to C20 aryl group, or $R^f$ and $R^g$ are bonded through a single bond, a substituted or unsubstituted C1 to C5 alkylene group, a substituted or unsubstituted C2 to C5 alkenylene group, a substituted or unsubstituted C6 to C20 arylene group, O, S, Se, Te, $CR^hR^i$, $SiR^jR^k$, or $GeR^lR^m$, wherein $R^h$ to $R^m$ are each independently hydrogen, a substituted or unsubstituted C1 to C30 alkyl group, a substituted or unsubstituted C6 to C20 aryl group, a substituted or unsubstituted C3 to C20 heterocyclic group, a halogen, a cyano group, or any combination thereof.

The compound may be represented by the Chemical Formula 1A.

The plurality of wavelength selective filters may include at least two of a blue filter, a green filter, a red filter, a cyan filter, a yellow filter, or a magenta filter.

The plurality of wavelength selective filters may further include an infrared filter.

The first perovskite photodiode may include a blue perovskite photodiode configured to selectively sense light in a blue wavelength spectrum, a green perovskite photodiode configured to selectively sense light in a green wavelength spectrum, and a red perovskite photodiode configured to selectively sense light in a red wavelength spectrum, wherein the blue perovskite photodiode, the green perovskite photodiode, and the red perovskite photodiode are arranged along an in-plane direction of the substrate, the wavelength selective filter layer may include a first wavelength selective filter overlapped with the blue perovskite photodiode and selected from a blue filter, a cyan filter, and a magenta filter, a second wavelength selective filter overlapped with the green perovskite photodiode and selected from a green filter, a cyan filter, and a yellow filter, and a third wavelength selective filter overlapped with the red perovskite photodiode and selected from a red filter, a yellow filter, and a magenta filter, wherein the first wavelength selective filter, the second wavelength selective filter, and the third wavelength selective filter may be different from each other.

The blue perovskite photodiode, the green perovskite photodiode, and the red perovskite photodiode may include the first perovskite photoelectric conversion layer including the first Pb-free perovskite in common, and a cut-off wavelength of the absorption spectrum of the first Pb-free perovskite may belong to more than about 650 nm and less than about 750 nm.

The first perovskite photodiode may further include an infrared perovskite photodiode configured to selectively sense light of an infrared wavelength spectrum, the infrared perovskite photodiode may be arranged in parallel with the blue perovskite photodiode, the green perovskite photodiode, and the red perovskite photodiode along an in-plane direction of the substrate, and the wavelength selective filter layer may further include an infrared filter arranged in parallel with the first wavelength selective filter, the second wavelength selective filter, and the third wavelength selective filter.

The blue perovskite photodiode, the green perovskite photodiode, the red perovskite photodiode, and the infrared perovskite photodiode may include the first perovskite photoelectric conversion layer including the first Pb-free perovskite in common, and a cut-off wavelength of an absorption spectrum of the first Pb-free perovskite may belong to about 800 nm to about 3000 nm.

The image sensor may further include an infrared photodiode stacked with the first perovskite photodiode.

The substrate may be a CMOS substrate, and the infrared photodiode may be a silicon photodiode integrated within the CMOS substrate.

The infrared photodiode may be a second perovskite photodiode stacked with the first perovskite photodiode on the substrate, and the second perovskite photodiode may include a third electrode and a fourth electrode, a second perovskite photoelectric conversion layer between the third electrode and the fourth electrode and including a second Pb-free perovskite having a cut-off wavelength belonging to about 800 nm to about 3000 nm, and a second auxiliary layer between the third electrode and the second perovskite photoelectric conversion layer and including the compound represented by Chemical Formula 1.

According to some example embodiments, an electronic device including the perovskite photodiode or the image sensor is provided.

A photodiode and an image sensor capable of increasing wavelength selectivity and process selectivity and improving optical and electrical characteristics may be implemented with a simple structure.

DETAILED DESCRIPTION

Figure 1:
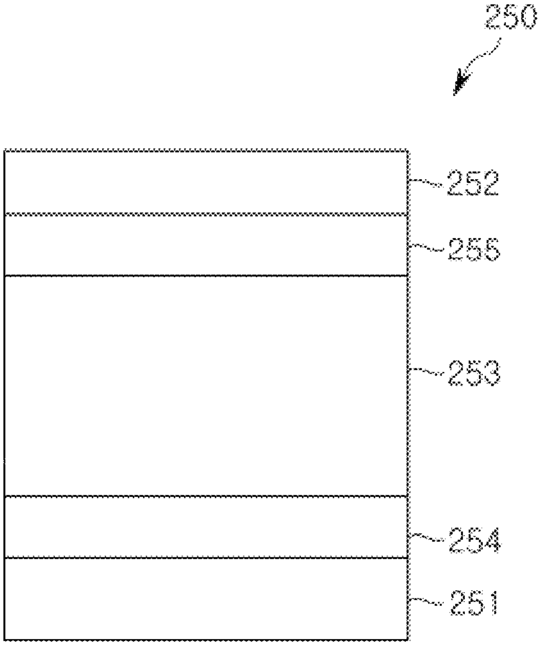
FIG. 1 is a cross-sectional view showing an example of a perovskite photodiode according to some example embodiments.

Hereinafter, some example embodiments are described in detail so that those skilled in the art can easily implement them. However, the actual applied structure may be implemented in various different forms and is not limited to the example embodiments described herein.

In the drawings, the thickness of layers, films, panels, regions, etc., are exaggerated for clarity. It will be understood that when an element such as a layer, film, region, or substrate is referred to as being "on" another element, it may be directly on the other element or intervening elements may also be present. In contrast, when an element is referred to as being "directly on" another element, there are no intervening elements present.

In the drawings, parts having no relationship with the description are omitted for clarity, and the same or similar constituent elements are indicated by the same reference numeral throughout the specification.

Hereinafter, the terms "lower portion" and "upper portion" are for convenience of description and do not limit the positional relationship.

Hereinafter, the upper portion of the image sensor is described as a light-receiving side, but this is for convenience of description and does not limit the positional relationship.

Hereinafter, "combination" refers to a mixture or a stacked structure of two or more.

As used herein, when a definition is not otherwise provided, "substituted" refers to replacement of hydrogen of a compound by a substituent selected from a halogen, a hydroxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid group or a salt thereof, a C1 to C30 alkyl group, a C2 to C30 alkenyl group, a C2 to C30 alkynyl group, a C6 to C30 aryl group, a C7 to C30 arylalkyl group, a C1 to C30 alkoxy group, a C1 to C20 heteroalkyl group, a C3 to C20 heterocyclic group, a C3 to C20 heteroarylalkyl group, a C3 to C30 cycloalkyl group, a C3 to C15 cycloalkenyl group, a C6 to C15 cycloalkynyl group, a C3 to C30 heterocycloalkyl group, and any combination thereof.

Hereinafter, when a definition is not otherwise provided, "hetero" refers to inclusion of one or four heteroatoms selected from N, O, S, Se, Te, Si, and P.

Hereinafter, when a definition is not otherwise provided, the energy level is the highest occupied molecular orbital (HOMO) energy level or the lowest unoccupied molecular orbital (LUMO) energy level.

Hereinafter, when a definition is not otherwise provided, a work function or energy level is expressed as an absolute value from a vacuum level. Also, a deep, high or large work function or energy level means that the absolute values are large with reference to a vacuum level of "0 eV" and shallow, low or small work function or energy level means that the absolute values are small with reference to a vacuum level of "0 eV."

Further, the differences between the work function and/or the energy level may be values obtained by subtracting a small value of the absolute value from a large value of the absolute value.

Hereinafter, when a definition is not otherwise provided, the HOMO energy level may be evaluated with an amount of photoelectrons emitted by energy when irradiating UV light to a thin film using AC-2 (Hitachi) or AC-3 (Riken Keiki Co., Ltd.).

Hereinafter, when a definition is not otherwise provided, the LUMO energy level may be obtained by obtaining an energy bandgap using a UV-Vis spectrometer (Shimadzu Corporation), and then calculating the LUMO energy level from the energy bandgap and the already measured HOMO energy level.

It will further be understood that when an element is referred to as being "on" another element, it may be above or beneath or adjacent (e.g., horizontally adjacent) to the other element. It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof. Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%, ±5%, ±3%, or ±1%). Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%, ±5%, ±3%, or ±1%). Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%, ±5%, ±3%, or ±1%). It will be understood that elements and/or properties thereof may be recited herein as being "identical" to, "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same. It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%, ±5%, ±3%, or ±1%) around the stated elements and/or properties thereof. While the term "same," "equal" or "identical" may be used in description of some example embodiments, it should be understood that some imprecisions may exist. Thus, when one element is referred to as being the same as another element, it should be understood that an element or a value is the same as another element within a desired manufacturing or operational tolerance range (e.g., ±10%, ±5%, ±3%, or ±1%). When the terms "about" or "substantially" are used in this specification in connection with a numerical value, it is intended that the associated numerical value includes a manufacturing or operational tolerance (e.g., ±10%, ±5%, ±3%, or ±1%) around the stated numerical value. Moreover, when the words "about" and "substantially" are used in connection with geometric shapes, it is intended that precision of the geometric shape is not required but that latitude for the shape is within the scope of the inventive concepts. Further, regardless of whether numerical values or shapes are modified as "about" or "substantially," it will be understood that these values and shapes should be construed as including a manufacturing or operational tolerance (e.g., ±10%, ±5%, ±3%, or ±1%) around the stated numerical values or shapes. When ranges are specified, the range includes all values therebetween such as increments of 0.1%.

As described herein, when an operation is described to be performed, or an effect such as a structure is described to be established "by" or "through" performing additional operations, it will be understood that the operation may be performed and/or the effect/structure may be established "based on" the additional operations, which may include performing said additional operations alone or in combination with other further additional operations.

As described herein, an element that is described to be "spaced apart" from another element, in general and/or in a particular direction (e.g., vertically spaced apart, laterally spaced apart, etc.) and/or described to be "separated from" the other element, may be understood to be isolated from direct contact with the other element, in general and/or in the particular direction (e.g., isolated from direct contact with the other element in a vertical direction, isolated from direct contact with the other element in a lateral or horizontal direction, etc.). Similarly, elements that are described to be "spaced apart" from each other, in general and/or in a particular direction (e.g., vertically spaced apart, laterally spaced apart, etc.) and/or are described to be "separated" from each other, may be understood to be isolated from direct contact with each other, in general and/or in the particular direction (e.g., isolated from direct contact with each other in a vertical direction, isolated from direct contact with each other in a lateral or horizontal direction, etc.). Similarly, a structure described herein to be between two other structures to separate the two other structures from each other may be understood to be configured to isolate the two other structures from direct contact with each other. As described herein, the terms "contact" and "direct contact" may be used interchangeably.

Hereinafter, a perovskite photodiode according to some example embodiments will be described.

A perovskite photodiode according to some example embodiments is a light absorption sensor capable of receiving light and converting it into an electrical signal, and may include perovskite as a photoelectric conversion material.

FIG. 1 is a cross-sectional view showing an example of a perovskite photodiode according to some example embodiments.

Referring to FIG. 1, a perovskite photodiode 250 according to some example embodiments includes a first electrode 251, a second electrode 252, a perovskite photoelectric conversion layer 253, a lower auxiliary layer 254, and an upper auxiliary layer 255.

A substrate (not shown) may be disposed under the first electrode 251 or on the second electrode 252. The substrate may be, for example, an inorganic substrate such as a glass plate or a silicon wafer, or an organic substrate made of a polymer such as polycarbonate, polymethylmethacrylate, polyethyleneterephthalate, polyethylenenaphthalate, polyamide, polyethersulfone, or any combination thereof. The substrate may be omitted.

The substrate may be, for example, a semiconductor substrate or a silicon substrate. The semiconductor substrate may include a circuit unit (not shown), and the circuit unit may include transfer transistors (not shown) and/or charge storage (not shown) integrated in the semiconductor substrate. The circuit unit may be electrically connected to the first electrode 251 or the second electrode 252.

One of the first electrode 251 or the second electrode 252 may be an anode and the other may be a cathode. For example, the first electrode 251 may be an anode and the second electrode 252 may be a cathode. For example, the first electrode 251 may be a cathode and the second electrode 252 may be an anode.

At least one of the first electrode 251 or the second electrode 252 may be a light transmitting electrode. The light transmitting electrode may be a transparent electrode or a transflective electrode. The transparent electrode may have a transmittance of greater than or equal to about 85%, greater than or equal to about 90%, or greater than or equal to about 95%, and the transflective electrode may have a light transmittance of greater than or equal to about 30% and less than about 85%, about 40% to about 80%, or about 40% to about 75%. The transparent electrode and the transflective electrode may include, for example, at least one of an oxide conductor, a carbon conductor, or a metal thin film. The oxide conductor may include for example at least one of indium tin oxide ITO, indium zinc oxide IZO, zinc tin oxide ZTO, aluminum tin oxide ATO, and aluminum zinc oxide AZO, the carbon conductor may include at least one of graphene and carbon nanostructure, and the metal thin film may be a very thin film including aluminum Al, magnesium Mg, silver Ag, gold Au, magnesium-silver Mg—Ag, magnesium-aluminum Mg—Al, an alloy thereof, or any combination thereof.

One of the first electrode 251 or the second electrode 252 may be a reflective electrode. The reflective electrode may include a reflective layer having a light transmittance of less than or equal to about 5% and/or a reflectance of greater than or equal to about 80%, and the reflective layer may include an optically opaque material. The optically opaque material may include a metal, a metal nitride, or any combination thereof, for example silver Ag, copper Cu, aluminum Al, gold Au, titanium Ti, chromium Cr, nickel Ni, an alloy thereof, a nitride thereof (e.g., TiN), or any combination thereof, but is not limited thereto. The reflective electrode may be formed of a reflective layer or may have a reflective layer/light transmitting layer or a stacked structure of a light transmitting layer/reflective layer/light transmitting layer, and the reflective layer may have one layer or two or more layers.

For example, each of the first electrode 251 and the second electrode 252 may be a light transmitting electrode, and either one of the first electrode 251 or the second electrode 252 may be a light-receiving electrode disposed on a light receiving side.

For example, the first electrode 251 may be a light transmitting electrode, the second electrode 252 may be a reflective electrode, and the first electrode 251 may be a light-receiving electrode.

For example, the first electrode 251 may be a reflective electrode, and the second electrode 252 may be a light transmitting electrode and the second electrode 252 may be a light-receiving electrode.

The perovskite photoelectric conversion layer 253 may include perovskite and may be configured to convert light absorbed by the perovskite into an electrical signal. The perovskite may be an inorganic or organic-inorganic light absorbing material having a particular (or, alternatively, predetermined) crystal structure, and may be a Pb-free perovskite that does not contain lead Pb (e.g., a Pb-free perovskite that does not contain any lead Pb). The Pb-free perovskite is environmentally friendly and may be effectively applied to semiconductor processes because it does not have the harmful effects of lead Pb. Herein, when a perovskite is referred to, it will be understood that the perovskite may be a Pb-free perovskite, for example a Pb-free perovskite that does not contain any lead Pb.

For example, the Pb-free perovskite may be a metal halide perovskite including metal cations and halide anions. For example, the Pb-free perovskite may be an organic-inorganic metal halide perovskite including an organic cation, a metal cation, and a halide anion.

For example, the Pb-free perovskite may be an organic-inorganic tin halide perovskite including a tin ion $Sn^{2+}$ as a metal cation, for example, an organic-inorganic tin iodide perovskite including a tin ion $Sn^{2+}$ as a metal cation and an iodide ion $I^-$ as a halide anion.

The Pb-free perovskite may include, for example, organic-inorganic tin halide perovskite represented by Chemical Formula 2.

[Chemical Formula 2]

$$FA_{1-a}X_aSnI_3$$

In Chemical Formula 2,

FA is formamidinium,

X is ethylene diammonium, methyl ammonium, $Cs^+$, substituted or unsubstituted C6 to C12 aromatic alkyl ammonium, substituted or unsubstituted C1 to C10 aliphatic ammonium, or any combination thereof, and $$0 \leq a \leq 1.$$

For example, X in Chemical Formula 2 may be ethylene diammonium, methylammonium, n-butylammonium, phenylethylammonium, or any combination thereof.

For example, the Pb-free perovskite may include $FASnI_3$, $FA_{1-a}EDA_aSnI_3$ ($0 \leq a \leq 1$) or any combination thereof, but is not limited thereto. Herein FA is formamidinium and EDA is ethylene diammonium.

The perovskite may be configured to absorb light of at least a portion of the visible to infrared wavelength spectrums. Herein, the visible wavelength spectrum may be for example greater than or equal to about 380 nm and less than about 750 nm, within the above range, about 380 nm to about 730 nm, about 380 nm to about 720 nm, about 380 nm to about 710 nm, about 380 nm to about 700 nm, about 380 nm to about 680 nm, about 380 nm to about 650 nm, greater than or equal to about 400 nm and less than about 750 nm, about 400 nm to about 730 nm, about 400 nm to about 720 nm, about 400 nm to about 710 nm, about 400 nm to about 700 nm, about 400 nm to about 680 nm, or about 400 nm to about 650 nm. Herein, the infrared wavelength spectrum may include a portion or all of the near-infrared, short-wave infrared, mid-wave infrared, and far-infrared wavelength spectrum, for example greater than about 750 nm and less than or equal to about 3000 nm, within the above range, greater than about 750 nm and less than or equal to about 2500 nm, greater than about 750 nm and less than or equal to about 2000 nm, greater than about 750 nm and less than or equal to about 1800 nm, greater than about 750 nm and less than or equal to about 1500 nm, about 800 nm to about 3000 nm, about 800 nm to about 2500 nm, about 800 nm to about 2000 nm, about 800 nm to about 1800 nm, or about 800 nm to about 1500 nm, but is not limited thereto.

For example, the absorption spectrum of perovskite may have a relatively high absorbance over a wavelength spectrum from a short wavelength (for example, a wavelength belonging to an X-ray or UV-ray region) to a visible wavelength spectrum. The absorption characteristics of perovskite may be represented by the cut-off wavelength of the absorption spectrum, and the cut-off wavelength of the absorption spectrum may be an end of the absorption spectrum, that is, the long-wavelength end-point of the wavelength spectrum that the perovskite may be configured to absorb. The cut-off wavelength of the absorption spectrum of the perovskite may be determined by an energy bandgap of the perovskite, and the perovskite may have an energy bandgap that matches the visible wavelength spectrum. For example, the energy bandgap of the perovskite may be about 1.1 eV to about 3.0 eV, within the above range, about 1.1 eV to about 2.8 eV or about 1.2 eV to about 2.5 eV.

For example, the absorption spectrum of the perovskite may include all of the visible wavelength spectrum, the cut-off wavelength of the perovskite may exist at the end-point of the visible wavelength spectrum or at a longer wavelength point, and for example it may belong to a wavelength spectrum of about 700 nm to about 3000 nm.

As an example, the cut-off wavelength of the absorption spectrum of the perovskite may be a boundary point between the visible wavelength spectrum and the infrared wavelength spectrum, and for example, may be greater than about 650 nm and less than about 750 nm, within the above range, about 670 nm to about 730 nm, about 680 nm to about 720 nm, or about 690 nm to about 710 nm.

For example, the absorption spectrum of the perovskite may have a relatively high absorbance from a short wavelength (e.g., a wavelength belonging to an X-ray and/or UV-ray region) to an infrared wavelength spectrum. The perovskite may have an energy bandgap that matches the infrared wavelength spectrum. For example, the cut-off wavelength of the absorption spectrum of the perovskite may be the end-point of the infrared wavelength spectrum to be photoelectrically converted, and may be a longer wavelength than the cut-off wavelength of the absorption spectrum of a perovskite absorbing the visible wavelength spectrum. For example, the cut-off wavelength of the absorption spectrum of the perovskite absorbing light in the infrared wavelength spectrum may belong to, for example, about 800 nm to about 3000 nm, and within the above range, about 800 nm to about 2500 nm, about 800 nm to about 2200 nm, about 800 nm to about 2000 nm, about 800 nm to about 1800 nm, about 800 nm to about 1500 nm, about 800 nm to about 1300 nm, about 900 nm to about 2500 nm, about 900 nm to about 2200 nm, about 900 nm to about 2000 nm, about 900 nm to about 1800 nm, about 900 nm to about 1500 nm, about 900 nm to about 1300 nm, about 1000 nm to about 2500 nm, about 1000 nm to about 2200 nm, about 1000 nm to about 2000 nm, about 1000 nm to about 1800 nm, about 1000 nm to about 1500 nm, or about 1000 nm to about 1300 nm.

The perovskite photoelectric conversion layer 253 may include one or two or more types of perovskites in order to have such light absorption characteristics, and may include different perovskites represented by Chemical Formula 2 or may further include perovskite structures other than the perovskite represented by Chemical Formula 2.

The perovskite may have wavelength selectivity because the cut-off wavelength of the absorption spectrum may be determined according to the energy bandgap as described above. Accordingly, unlike silicon configured to uniformly absorb light of a broad wavelength spectrum from a short wavelength (around 200 nm) to an infrared wavelength spectrum without wavelength selectivity, even without a separate infrared blocking filter, the perovskite photoelectric conversion layer 253 may exclude light of the infrared wavelength spectrum and absorb light of the visible wavelength spectrum.

In addition, since the perovskite may have an absorbance of about 10 times or more (e.g., about 10 times to about 1000 times) compared to silicon, it may have a higher absorption characteristic than a silicon photodiode. For example, the thickness of the perovskite photoelectric conversion layer 253 for absorbing the same amount of light may be reduced to about 1/10 or less than the thickness of a silicon photodiode. The perovskite photoelectric conversion layer 253 may have a relatively thin thickness due to such high light absorption characteristics, for example, about 100 nm to about 800 nm, about 100 nm to about 700 nm, about 100 nm to about 500 nm, or about 200 nm to about 500 nm.

In addition, since the perovskite has a charge mobility of about 1000 times or more (for example, about 1000 times to about $10^6$ times) higher than the organic photoelectric conversion material, it may have high photoelectric conversion efficiency and low remaining charges in addition to the aforementioned high light absorption characteristics. As a result, a photodiode may have improved photoelectric conversion performance, efficiency, and/or sensitivity and thus improved image generation performance and efficiency based on including a perovskite photoelectric conversion layer that includes a perovskite (e.g., a Pb-free perovskite).

In addition, the perovskite may be applied to both solution processes such as spin coating, slit coating, and inkjet coating, or deposition processes such as vacuum deposition and thermal deposition, and thus process selectivity may be broadened and it may be applied to semiconductor processes requiring fine patterning effectively.

The lower auxiliary layer 254, also referred to herein interchangeably as an auxiliary layer, a first auxiliary layer, or the like, is disposed between (e.g., directly or indirectly between) the first electrode 251 and the perovskite photoelectric conversion layer 253. For example, the lower auxiliary layer 254 may be in contact with the perovskite photoelectric conversion layer 253, and for example, one surface of the lower auxiliary layer 254 may be in contact with the perovskite photoelectric conversion layer 253 and the other surface (e.g., opposite surface) of the lower auxiliary layer 254 may be in contact with the first electrode 251.

The lower auxiliary layer 254 may be an organic layer including organic single molecules, for example, an organic layer including depositable organic single molecules.

For example, the lower auxiliary layer 254 may include a compound having an asymmetric core including different fused rings, and the compound may be for example represented by Chemical Formula 1.

[Chemical Formula 1]

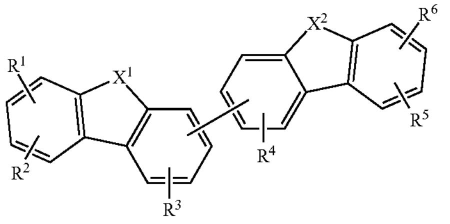

In Chemical Formula 1, $X^1$ and $X^2$ are different from each other and each is $CR^aR^b$, $SiR^cR^d$, or $NR^e$, for example such that $X^1$ and $X^2$ may each independently be a different one of $CR^aR^b$, $SiR^cR^d$, or $NR^e$, $R^1$ to $R^6$ are each independently hydrogen, a substituted or unsubstituted C1 to C30 alkyl group, a substituted or unsubstituted C1 to C30 alkoxy group, a substituted or unsubstituted C6 to C20 aryl group, a substituted or unsubstituted C3 to C20 heterocyclic group, a halogen, a cyano group, —$NR^fR^g$, or any combination thereof, at least one of $R^1$ or $R^6$ is a substituted or unsubstituted C6 to C20 aryl group, a substituted or unsubstituted C3 to C20 heterocyclic group, —$NR^fR^g$, or any combination thereof, $R^a$ to $R^g$ are each independently hydrogen, a substituted or unsubstituted C1 to C30 alkyl group, a substituted or unsubstituted C6 to C20 aryl group, a substituted or unsubstituted C3 to C20 heterocyclic group, a halogen, a cyano group, or any combination thereof, $R^a$ and $R^b$ are each independently present or are combined with each other to form a ring (e.g., a first ring), $R^c$ and $R^d$ are each independently present or are combined with each other to form a ring (e.g., a second ring), and $R^f$ and $R^g$ are each independently present or are combined with each other to form a ring (e.g., a third ring).

For example, in Chemical Formula 1, $X^1$ may be $CR^aR^b$ or $SiR^cR^d$, and $X^2$ may be $NR^e$. For example, $R^a$ to $R^d$ may each independently be hydrogen, a substituted or unsubstituted C1 to C30 alkyl group or a substituted or unsubstituted C6 to C20 aryl group, and for example $R^a$ to $R^d$ may each independently be hydrogen, a substituted or unsubstituted methyl group, a substituted or unsubstituted ethyl group, a substituted or unsubstituted propyl group, a substituted or unsubstituted butyl group, a substituted or unsubstituted pentyl group, a substituted or unsubstituted hexyl group, a substituted or unsubstituted heptyl group, a substituted or unsubstituted octyl group, a substituted or unsubstituted phenyl group, a substituted or unsubstituted biphenyl group, a substituted or unsubstituted naphthyl group, a substituted or unsubstituted anthracenyl group, a substituted or unsubstituted phenanthryl group, or any combination thereof. For example, $R^e$ may be a substituted or unsubstituted C6 to C20 aryl group, for example a substituted or unsubstituted phenyl group, a substituted or unsubstituted biphenyl group, a substituted or unsubstituted naphthyl group, a substituted or unsubstituted anthracenyl group, a substituted or unsubstituted phenanthryl group, or any combination thereof.

For example, in Chemical Formula 1, $X^1$ may be $CR^aR^b$ and $X^2$ may be $NR^e$.

For example, at least one of $R^1$ and $R^6$ may be —$NR^fR^g$, and for example, $R^1$ and $R^6$ may each be —$NR^fR^g$. For example, $R^f$ and $R^g$ may combine to form a ring (e.g., a third ring, a separate ring, etc.), and may be for example bonded through a single bond, a substituted or unsubstituted C1 to C5 alkylene group, a substituted or unsubstituted C2 to C5 alkenylene group, a substituted or unsubstituted C6 to C20 arylene group, O, S, Se, Te, $CR^hR^i$, $SiR^jR^k$, or $GeR^lR^m$ to form the ring (e.g., the separate ring, the third ring, etc.). $R^h$ to $R^m$ may each independently be hydrogen, a substituted or unsubstituted C1 to C30 alkyl group, a substituted or unsubstituted C6 to C20 aryl group, a substituted or unsubstituted C3 to C20 heterocyclic group, a halogen, a cyano group, or any combination thereof.

For example, at least one of $R^1$ and $R^6$ may be one of groups listed in Group 1, and for example, $R^1$ and $R^6$ may each be one of groups (e.g., a plurality of groups) listed in Group 1.

[Group 1]

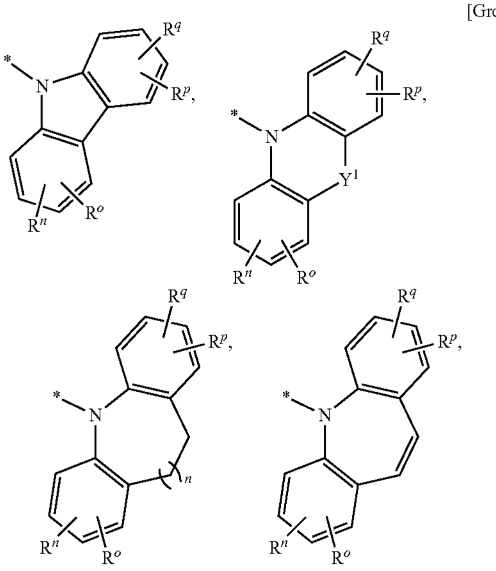

-continued

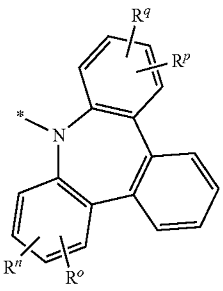

In Group 1, $Y^1$ may be O, S, Se, Te, $CR^hR^i$, $SiR^jR^k$, or $GeR^lR^m$, $R^h$ to $R^q$ may each independently be hydrogen, a substituted or unsubstituted C1 to C30 alkyl group, a substituted or unsubstituted C6 to C20 aryl group, a substituted or unsubstituted C3 to C20 heterocyclic group, a halogen, a cyano group, or any combination thereof, n may be an integer of 0 to 2, and

* may be a linking point with Chemical Formula 1.

For example, $R^2$ to $R^5$ may each independently be hydrogen, a substituted or unsubstituted C1 to C30 alkyl group, a halogen, a cyano group, or any combination thereof, and for example, $R^2$ to $R^5$ may each independently be hydrogen.

For example, the compound represented by Chemical Formula 1 may be represented by Chemical Formula 1A.

[Chemical Formula 1A]

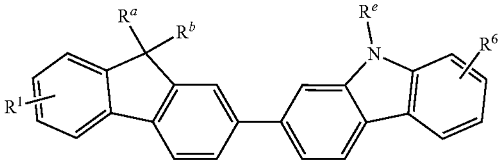

In Chemical Formula 1A, $R^a$, $R^b$, $R^e$, $R^1$, and $R^6$ are the same as described above. For example, $R^a$ and $R^b$ may each independently be hydrogen, a substituted or unsubstituted C1 to C30 alkyl group or a substituted or unsubstituted C6 to C20 aryl group, $R^e$ may be a substituted or unsubstituted C6 to C20 aryl group, and $R^1$ and $R^6$ may each be one of the plurality of groups listed in Group 1:

[Group 1]

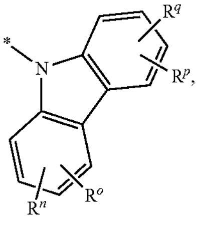

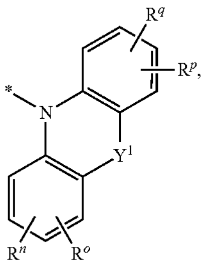

-continued

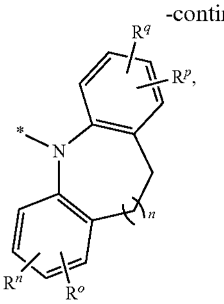

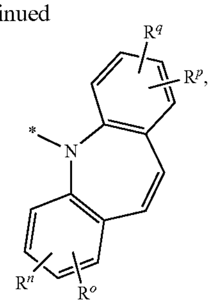

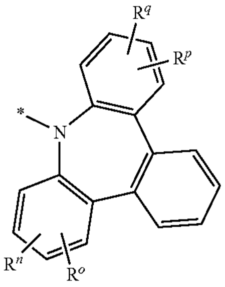

In Group 1, $Y^1$ may be O, S, Se, Te, $CR^hR^i$, $SiR^jR^k$, or $GeR^lR^m$, $R^h$ to $R^q$ may each independently be hydrogen, a substituted or unsubstituted C1 to C30 alkyl group, a substituted or unsubstituted C6 to C20 aryl group, a substituted or unsubstituted C3 to C20 heterocyclic group, a halogen, a cyano group, or any combination thereof, n may be an integer of 0 to 2, and

* may be a linking point with Chemical Formula 1A.

For example, the compound represented by Chemical Formula 1A may be represented by Chemical Formula 1AA.

[Chemical Formula 1AA]

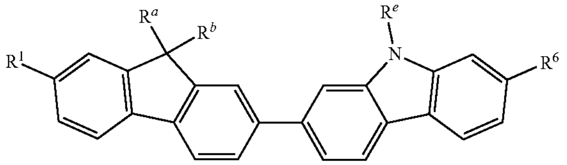

In Chemical Formula 1AA, $R^a$, $R^b$, $R^e$, $R^1$, and $R^6$ are the same as described above. For example, $R^a$ and $R^b$ may each independently be hydrogen, a substituted or unsubstituted C1 to C30 alkyl group or a substituted or unsubstituted C6 to C20 aryl group, $R^e$ may be a substituted or unsubstituted C6 to C20 aryl group, and $R^1$ and $R^6$ may each be one of the plurality of groups listed in Group 1:

[Group 1]

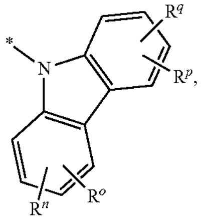

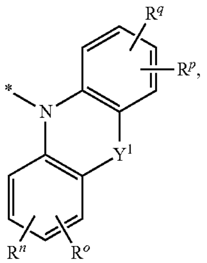

-continued

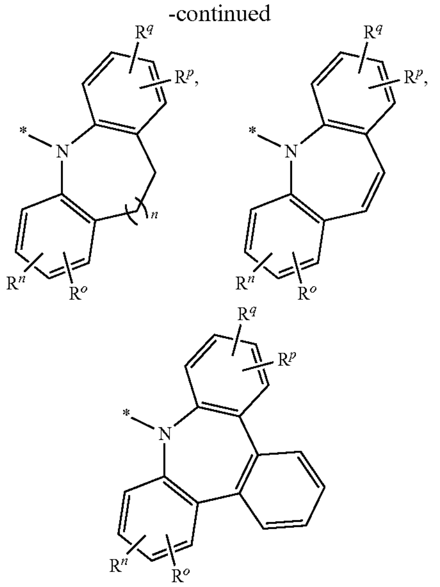

In Group 1, $Y^1$ may be O, S, Se, Te, $CR^hR^i$, $SiR^jR^k$, or $GeR^lR^m$, $R^h$ to $R^q$ may each independently be hydrogen, a substituted or unsubstituted C1 to C30 alkyl group, a substituted or unsubstituted C6 to C20 aryl group, a substituted or unsubstituted C3 to C20 heterocyclic group, a halogen, a cyano group, or any combination thereof, n may be an integer of 0 to 2, and

* may be a linking point with Chemical Formula 1AA.

The compound may be a depositable organic semiconductor that has high heat resistance and satisfies a particular (or, alternatively, predetermined) energy level, and may be effectively applied as an auxiliary layer of a perovskite photodiode due to such characteristics.

For example, the compound may have a relatively high glass transition temperature due to an asymmetric core structure, and for example, the glass transition temperature of the compound may be greater than or equal to about 170° C., greater than or equal to about 180° C., greater than or equal to about 190° C., greater than or equal to about 195° C., greater than or equal to about 200° C., or greater than or equal to about 210° C., within the above range, about 170° C. to about 400° C., about 180° C. to about 400° C., about 190° C. to about 400° C., about 195° C. to about 400° C., about 200° C. to about 400° C., or about 210° C. to about 400° C. Accordingly, the lower auxiliary layer 254 including the compound may have high heat resistance that is not easily deteriorated in a subsequent process, for example based on the compound being represented by Chemical Formula 1. As a result, a perovskite photodiode 250 may have a reduced likelihood of manufacturing process defects in the lower auxiliary layer 254 resulting from manufacturing processes performed subsequently to depositing the lower auxiliary layer 254, and thus the perovskite photodiode 250 may have improved reliability, based on the high heat resistance of the lower auxiliary layer 254.

For example, the compound may be sublimated without decomposition or polymerization within a particular (or, alternatively, predetermined) temperature range. For example, the temperature $Ts_{10}$ at which a weight loss of a sample of the compound of 10% compared to the initial weight of the sample occurs during thermogravimetric analysis at a pressure of about 1 Pa or less (e.g., about 0.01 Pa to about 1 Pa, about 0.1 Pa to about 1 Pa, about 0.2 Pa to about 1 Pa, or the like) may be about 180° C. to about 450° C., about 190° C. to about 450° C., about 200° C. to about 450° C., about 210° C. to about 450° C., or about 220° C. to about 450° C., and a temperature at which a weight loss of 50% compared to the initial weight of the sample ($Ts_{50}$) occurs may be about 200° C. to about 500° C., about 220° C. to about 500° C., or about 250° C. to about 500° C. By having such high heat resistance, the compound may be stably and repeatedly deposited and may maintain good performance without deterioration in subsequent high-temperature processes. As a result, a perovskite photodiode 250 may have a reduced likelihood of manufacturing process defects in the lower auxiliary layer 254 resulting from manufacturing processes performed subsequently to depositing the lower auxiliary layer 254, and thus the perovskite photodiode 250 may have improved reliability, based on the high heat resistance of the lower auxiliary layer 254.

As described above, the compound may satisfy a particular (or, alternatively, predetermined) energy level due to a structure having an asymmetric core. For example, a LUMO energy level of the compound may be less than or equal to about 2.80 eV, less than or equal to about 2.75 eV, less than or equal to about 2.70 eV, less than or equal to about 2.65 eV, or less than or equal to about 2.60 eV, within the above range, about 2.00 eV to about 2.80 eV, about 2.00 eV to about 2.75 eV, about 2.00 eV to about 2.70 eV, about 2.00 eV to about 2.65 eV, or about 2.00 eV to about 2.60 eV. For example, a HOMO energy level of the compound may be less than or equal to about 5.70 eV, less than or equal to about 5.68 eV, or less than or equal to about 5.65 eV, within the above range, about 5.20 eV to about 5.70 eV, about 5.20 eV to about 5.68 eV, or about 5.20 eV to about 5.65 eV.

Since the compound has the energy levels, the lower auxiliary layer 254 may effectively extract the first charges (e.g., holes) separated from the perovskite photoelectric conversion layer 253 toward the first electrode 251, and at the same time, when a voltage is applied from the outside, reverse injection of second charges (e.g., electrons) from the first electrode 251 to the perovskite photoelectric conversion layer 253 may be effectively blocked. Accordingly, electrical characteristics of the perovskite photodiode 250 may be improved by effectively reducing remaining charge and dark current while increasing photoelectric conversion efficiency of the perovskite photodiode 250. As a result, electrical characteristics, photoelectric conversion efficiency, and/or sensitivity of the perovskite photodiode 250 may be improved based on the perovskite photodiode 250 including a lower auxiliary layer 254, between the perovskite photoelectric conversion layer 253 and the first electrode 251, that includes the compound represented by Chemical Formula 1.

The upper auxiliary layer 255, also referred to herein as a separate auxiliary layer, a second auxiliary layer, or the like, is disposed between (e.g., directly or indirectly between) the second electrode 252 and the perovskite photoelectric conversion layer 253. The upper auxiliary layer 255 may be a charge auxiliary layer that controls the mobility of charges (e.g., electrons) moving from the perovskite photoelectric conversion layer 253 and/or a light-absorption auxiliary layer that improves light absorption characteristics, and may include one or two or more layers.

The upper auxiliary layer 255 may include organic, inorganic, and/or organic-inorganic materials, for example a metal halide such as LiF, NaCl, CsF, RbCl, and RbI; a lanthanide metal such as Yb; a metal such as calcium (Ca), potassium (K), aluminum (Al), or an alloy thereof; a metal oxide such as $Li_2O$ and BaO; fullerenes such as C60, C70 or a derivative thereof; Liq (lithium quinolate), Alq3 (tris(8-hydroxyquinolinato)aluminum), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazolyl-1-ylphenyl)-9,10-dinaphthylanthracene, TPBi (1,3,5-tri(1-phenyl-1H-benzo[d]imidazol-2-yl)phenyl), BCP (2,9-dimethyl-4,7-diphenyl-1,10-phenanthroline), Bphen (4,7-diphenyl-1,10-phenanthroline), TAZ (3-(4-biphenylyl)-4-phenyl-5-tertbutylphenyl-1,2,4-triazole), NTAZ (4-(naphthalen-1-yl)-3,5-diphenyl-4H-1,2,4-triazole), tBu-PBD (2-(4-biphenylyl)-5-(4-tert-butylphenyl)-1,3,4-oxadiazole), BAlq (bis(2-methyl-8-quinolinolato-N1,O8)-(1,1'-biphenyl-4-olato)aluminum), $Bebq_2$ (berylliumbis(benzoquinolin-10-olate), ADN (9,10-di(naphthalene-2-yl)anthracene), BmPyPhB (1,3-bis[3,5-di(pyridin-3-yl)phenyl]benzene), or any combination thereof, but is not limited thereto.

The upper auxiliary layer 255 may be omitted.

The perovskite photodiode 250 may further include an anti-reflection layer (not shown) under the first electrode 251 or on the second electrode 252. For example, when the first electrode 251 is a light-receiving electrode, the anti-reflection layer may be positioned below the first electrode 251. For example, when the second electrode 252 is a light-receiving electrode, the anti-reflection layer may be disposed on the second electrode 252. The anti-reflection layer may further improve light absorption by lowering reflectance of incident light by being disposed at a side where light is incident. The anti-reflection layer may include, for example, a material having a refractive index of about 1.6 to about 2.5, and may include, for example, at least one of a metal oxide, a metal sulfide, or an organic material having a refractive index within the above range. The anti-reflection layer may include, for example a metal oxide such as aluminum-containing oxide, molybdenum-containing oxide, tungsten-containing oxide, vanadium-containing oxide, rhenium-containing oxide, niobium-containing oxide, tantalum-containing oxide, titanium-containing oxide, nickel-containing oxide, copper-containing oxide, cobalt-containing oxide, manganese-containing oxide, chromium-containing oxide, tellurium-containing oxide, or any combination thereof; a metal sulfide such as zinc sulfide; or an organic material such as an amine derivative, but is not limited thereto.

Figure 2:
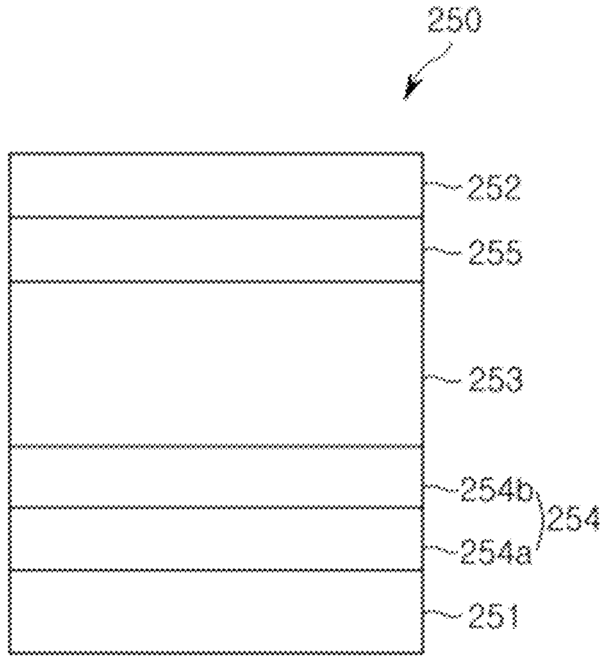
FIG. 2 is a cross-sectional view showing another example of a perovskite photodiode according to some example embodiments.

FIG. 2 is a cross-sectional view showing another example of a perovskite photodiode according to some example embodiments.

Referring to FIG. 2, the perovskite photodiode 250 according to some example embodiments includes a first electrode 251, a second electrode 252, and a perovskite photoelectric conversion layer 253, a lower auxiliary layer 254, and an upper auxiliary layer 255, as in some example embodiments, including the example embodiments shown in FIG. 1.

However, the perovskite photodiode 250 according to some example embodiments, including the example embodiments shown in FIG. 2, includes a bi-layered lower auxiliary layer 254, unlike some example embodiments, including the example embodiments shown in FIG. 1. That is, the lower auxiliary layer 254 includes a first lower auxiliary layer 254*a* close to the first electrode 251 and a second lower auxiliary layer 254*b* close to the perovskite photoelectric conversion layer 253, for example such that the second lower auxiliary layer 254*b* is between the first lower auxiliary layer 254*a* and the perovskite photoelectric conversion layer 253 and the first lower auxiliary layer 254*a* is between the second lower auxiliary layer 254*b* and the first electrode 251. The first and second lower auxiliary layers 254*a* and 254*b* may be in contact with each other. Any one of the first lower auxiliary layer 254*a* or the second lower auxiliary layer 254*b* may include the compound represented by Chemical Formula 1, and the other of the first lower auxiliary layer 254*a* and the second lower auxiliary layer 254*b* may include a material having charge transport characteristics in addition to the aforementioned compounds. For example, the first lower auxiliary layer 254*a* may include the compound represented by Chemical Formula 1, and the second lower auxiliary layer 254*b* may include a material having charge transport characteristics in addition to the aforementioned compounds (e.g., in addition to the compound represented by Chemical Formula 1).

The material having charge transport characteristics may include a phthalocyanine compound such as copper phthalocyanine; DNTPD (N,N'-diphenyl-N,N'-bis-[4-(phenyl-m-tolyl-amino)-phenyl]-biphenyl-4,4'-diamine), m-MTDATA (4,4',4"-[tris(3-methylphenyl)phenylamino]triphenylamine), TDATA (4,4'4"-tris(N,N-diphenylamino)triphenylamine), 2-TNATA (4,4',4"-tris{N,N-(2-naphthyl)-N-phenylamino}-triphenylamine), PEDOT/PSS (poly(3,4-ethylenedioxythiophene)/poly(4-styrenesulfonate)), PANI/DBSA (polyaniline/dodecylbenzenesulfonic acid), PANI/CSA (polyaniline/Camphor sulfonic acid), PANI/PSS (polyaniline/poly(4-styrenesulfonate)), NPB (N,N'-di(naphthalene-1-yl)-N,N'-diphenylbenzidine), polyetherketone including triphenylamine (TPAPEK), 4-isopropyl-4'-methyldiphenyliodonium[tetrakis(pentafluorophenyl)borate], HAT-CN (dipyrazino[2,3-f: 2',3'-h]quinoxaline-2,3,6,7,10,11-hexacarbonitrile), a carbazole-based derivative such as N-phenylcarbazole, polyvinylcarbazole, and the like, a fluorene-based derivative, TPD (N,N'-bis(3-methylphenyl)-N,N'-diphenyl-[1,1-biphenyl]-4,4'-diamine), a triphenylamine-based derivative such as TCTA (4,4',4"-tris(N-carbazolyl) triphenylamine), NPB (N,N'-di(naphthalene-1-yl)-N,N'-diphenyl-benzidine), TAPC (4,4'-cyclohexylidene bis[N,N-bis(4-methylphenyl)benzenamine]), HMTPD (4,4'-bis[N,N'-(3-tolyl)amino]-3,3'-dimethylbiphenyl), mCP (1,3-bis(N-carbazolyl)benzene), or any combination thereof, but is not limited thereto.

As such, the perovskite photodiode 250 includes the bi-layered lower auxiliary layer 254, so that dark current and leakage current may be more effectively reduced while having equal or improved charge transportability. As a result, electrical characteristics, photoelectric conversion efficiency, and/or sensitivity of the perovskite photodiode 250 may be improved based on the perovskite photodiode 250 including a lower auxiliary layer 254, between the perovskite photoelectric conversion layer 253 and the first electrode 251, that includes the bi-layered lower auxiliary layer 254, including a first lower auxiliary layer 254*a* and a second lower auxiliary layer 254*b*, where any one of the first lower auxiliary layer 254*a* or the second lower auxiliary layer 254*b* may include the compound represented by Chemical Formula 1, and the other of the first lower auxiliary layer 254*a* and the second lower auxiliary layer 254*b* may include a material having charge transport characteristics in addition to the aforementioned compounds.

The perovskite photodiode 250 according to some example embodiments, including the example embodiments shown in FIG. 1 and/or FIG. 2, may be for example included in an image sensor.

For example, the aforementioned perovskite photodiode 250 may be included in an image sensor, and may be applied to an image sensor suitable for high-speed imaging by having improved optical and electrical characteristics as described above.

Hereinafter, an image sensor according to some example embodiments is described.

Figure 3:
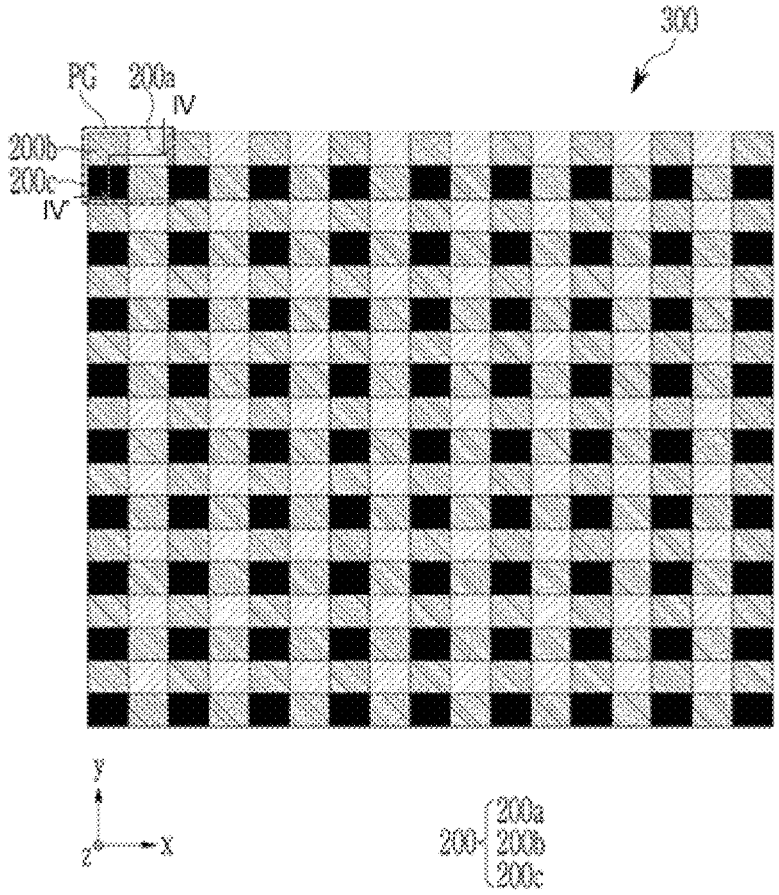
FIG. 3 is a plan view illustrating an example of pixels of an image sensor according to some example embodiments.
Figure 4:
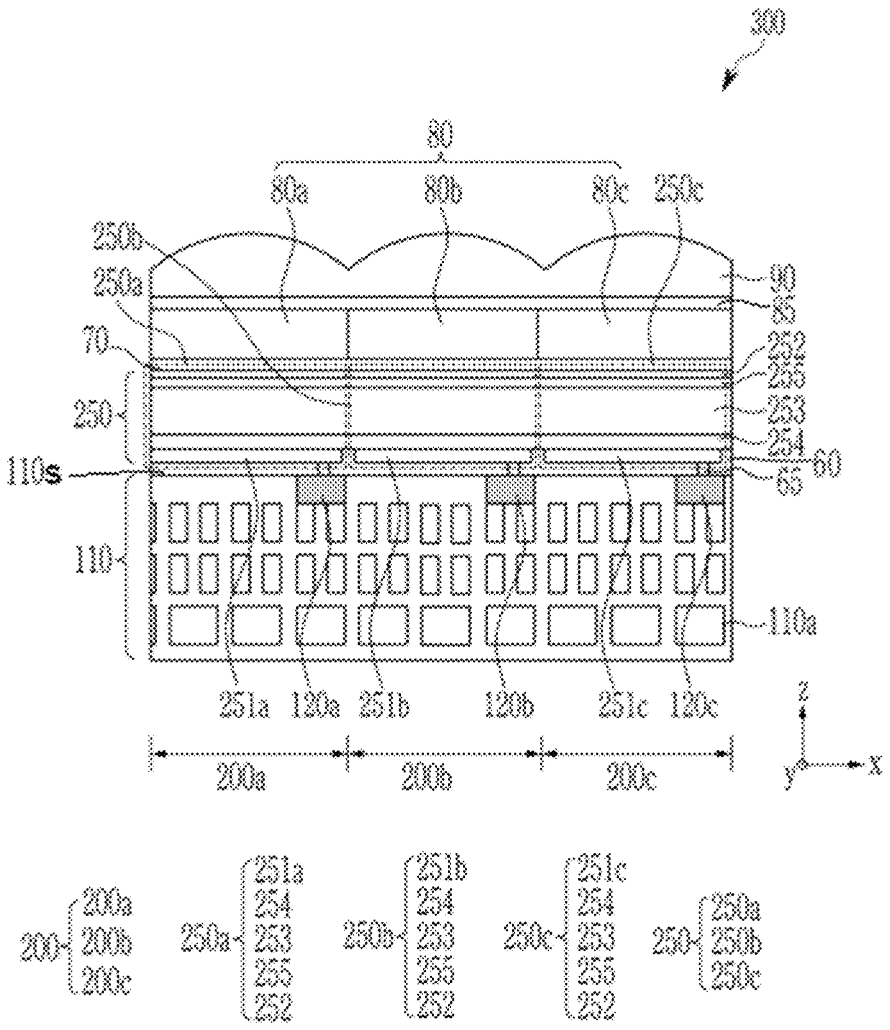
FIG. 4 is a cross-sectional view showing an example of the image sensor of FIG. 3 along cross-sectional view line IV-IV' of FIG. 3 according to some example embodiments.

FIG. 3 is a plan view illustrating an example of pixels of an image sensor according to some example embodiments, and FIG. 4 is a cross-sectional view showing an example of the image sensor of FIG. 3 along cross-sectional view line IV-IV' of FIG. 3 according to some example embodiments.

Referring to FIG. 3, the image sensor 300 includes a plurality of pixels 200 configured to absorb light of different first, second, and third wavelength spectrums belonging to a visible wavelength spectrum and perform photoelectric conversion. The plurality of pixels 200 may include a blue pixel 200*a* configured to selectively sense light of a blue wavelength spectrum, a green pixel 200*b* configured to selectively sense light of a green wavelength spectrum, or a red pixel 200*c* configured to selectively sense light of a red wavelength spectrum, and each pixel 200 may be a blue pixel 200*a*, a green pixel 200*b*, or a red pixel 200*c*. The image sensor 300 may obtain a particular (or, alternatively, predetermined) image by combining electrical signals obtained from the blue pixel 200*a*, the green pixel 200*b*, and the red pixel 200*c*. At least one blue pixel 200*a*, at least one green pixel 200*b*, and at least one red pixel 200*c* may form one pixel group PG and may be repeatedly arranged along rows and/or columns. Each pixel group PG may include, for example, one blue pixel 200*a*, two green pixels 200*b*, and one red pixel 200*c*, but is not limited thereto.

Referring to FIG. 4, the image sensor 300 includes a substrate 110, a perovskite photodiode 250 (also referred to herein interchangeably as a first perovskite photodiode 250), a wavelength selective filter layer 80, insulating layers 60 and 70, and a focusing lens 90.

The substrate 110 may be a semiconductor substrate, for example, a silicon substrate. The substrate 110 may be, for example, a CMOS (Complementary Metal-Oxide Semiconductor) substrate, and may include a CMOS circuit unit 110*a*. The substrate 110 may include charge storages 120*a*, 120*b*, and 120*c* and a transmission transistor (not shown). The charge storages 120*a*, 120*b*, and 120*c* are electrically connected to the perovskite photodiode 250 through conductive vias 65 (e.g., comprising a conductive material such as a metal, such as Cu). The charge storages 120*a*, 120*b*, and 120*c* and the first perovskite photodiode 250 may be separated by an insulating layer 60 through which the conductive vias 65 extend. A metal wire (not shown) and a pad (not shown) may be formed under or on the substrate 110.

The first perovskite photodiode 250 is on the substrate 110, for example on the substrate 110 in a vertical direction extending perpendicular to an upper surface 110*s* of the substrate 110 (e.g., the z direction). The perovskite photodiode 250 may be electrically separated for each pixel 200*a*, 200*b*, and 200*c*, and includes the blue perovskite photodiode 250*a* included in the blue pixel 200*a*, the green perovskite photodiode 250*b* included in the green pixel 200*b*, and a red perovskite photodiode 250*c* included in a red pixel 200*c*. The blue perovskite photodiode 250*a*, the green perovskite photodiode 250*b*, and the red perovskite photodiode 250*c* are arranged along the in-plane direction (e.g., xy direction) of the substrate 110 (e.g., parallel to the upper surface 110*s* of the substrate 110) to form a visible light diode array.

The blue perovskite photodiode 250*a*, the green perovskite photodiode 250*b*, and the red perovskite photodiode 250*c* may respectively include separate first electrodes of the first electrodes 251*a*, 251*b*, and 251*c*, and separate portions of the second electrode 252 (which may be a single, unitary piece of material), separate portions of the first perovskite photoelectric conversion layer 253, also referred to herein interchangeably as the perovskite photoelectric conversion layer 253 and which may be a single, unitary piece of material, between the first electrodes 251*a*, 251*b*, and 251*c*, and the second electrode 252, separate portions of a lower auxiliary layer 254 (which may be a single, unitary piece of material) between the first electrodes 251*a*, 251*b*, and 251*c* and the first perovskite photoelectric conversion layer 253, and separate portions of an upper auxiliary layer 255 (which may be a single, unitary piece of material) between the second electrode 252 and the first perovskite photoelectric conversion layer 253, and descriptions of the first electrodes 251*a*, 251*b*, and 251*c*, the second electrode 252, the lower auxiliary layer 254, and the upper auxiliary layer 255 are the same as described above. The first perovskite photoelectric conversion layer 253 is the same as the aforementioned perovskite photoelectric conversion layer 253, and are included on a blue perovskite photodiode 250*a*, a green perovskite photodiode 250*b*, and a red perovskite photodiode 250*c* in common. For example, the blue perovskite photodiode 250*a*, the green perovskite photodiode 250*b*, and the red perovskite photodiode 250*c* may include separate, respective portions of the perovskite photoelectric conversion layer 253 which is a single, unitary piece of material.

The first perovskite photoelectric conversion layer 253 may include the aforementioned perovskite (e.g., the aforementioned Pb-free perovskite), and may be configured to absorb light of the blue wavelength spectrum (or light including the blue wavelength spectrum), light of the green wavelength spectrum (or light including the green wavelength spectrum), or light of the red wavelength spectrum (or light including the red wavelength spectrum) transmitted through the first, second, and third wavelength selective filters 80*a*, 80*b*, and 80*c*, respectively, and convert it (the absorbed light) into an electrical signal.

The wavelength selective filter layer 80 may be on the perovskite photodiode 250 in the vertical direction (e.g., the z direction). The wavelength selective filter layer 80 may be overlapped with the perovskite photodiode 250 in the vertical direction extending perpendicular to the upper surface 110*s* of the substrate 110. The wavelength selective filter layer 80 may be configured to selectively transmit light of a particular (or, alternatively, predetermined) wavelength spectrum among incident visible wavelength spectrum light, and may be configured to absorb and/or reflect light of the remaining wavelength spectrum except for a particular (or, alternatively, predetermined) wavelength spectrum among the visible wavelength spectrum. The wavelength selective filter layer 80 may provide wavelength selectivity of the light to be photoelectrically converted, to the blue perovskite photodiode 250*a*, the green perovskite photodiode 250*b*, and the red perovskite photodiode 250*c* disposed thereunder.

The wavelength selective filter layer 80 includes a plurality of wavelength selective filters. For example, the wavelength selective filter layer 80 includes a first wavelength selective filter 80*a* included in the blue pixel 200*a*, a second wavelength selective filter 80*b* included in the green pixel 200*b*, and a third wavelength selective filter 80*c* included in the red pixel 200*c*. The first wavelength selective filter 80*a* may be overlapped with the blue perovskite photodiode 250*a* in the blue pixel 200*a* (e.g. partially or completely overlapped with the blue perovskite photodiode 250*a* in the vertical direction extending perpendicular to the upper surface 110*s* of the substrate 110) and may be disposed on the blue perovskite photodiode 250*a*. The second wavelength selective filter 80*b* may be overlapped with the green perovskite photodiode 250*b* in the green pixel 200*b* (e.g. partially or completely overlapped with the green perovskite photodiode 250*b* in the vertical direction extending perpendicular to the upper surface 110*s* of the substrate 110) and may be disposed on the green perovskite photodiode 250*b*. The third wavelength selective filter 80*c* may be overlapped with the red perovskite photodiode 250*c* in the red pixel 200*c* (e.g. partially or completely overlapped with the red perovskite photodiode 250*c* in the vertical direction extending perpendicular to the upper surface 110*s* of the substrate 110) and may be disposed on the red perovskite photodiode 250*c*. The first wavelength selective filter 80*a*, the second wavelength selective filter 80*b*, and the third wavelength selective filter 80*c* may be different from each other and may be, for example, selected from a blue filter, a green filter, a red filter, a cyan filter, a yellow filter, and a magenta filter.

For example, the first wavelength selective filter 80*a* may be configured to selectively transmit light of a particular (or, alternatively, predetermined) wavelength spectrum including a blue wavelength spectrum among the visible wavelength spectrum, and may be, for example, a blue filter, a cyan filter, or a magenta filter.

For example, the second wavelength selective filter 80*b* may be configured to selectively transmit light of a particular (or, alternatively, predetermined) wavelength spectrum including a green wavelength spectrum among the visible wavelength spectrum, and may be, for example, a green filter, a cyan filter, or a yellow filter.

For example, the third wavelength selective filter 80*c* may be configured to selectively transmit light of a particular (or, alternatively, predetermined) wavelength spectrum including a red wavelength spectrum among the visible wavelength spectrum, and may be, for example, a red filter, a yellow filter, or a magenta filter.

For example, the first, second, and third wavelength selective filters 80*a*, 80*b*, and 80*c* may each be a blue filter, a green filter, and a red filter. For example, the first, second, and third wavelength selective filters 80*a*, 80*b*, and 80*c* may each be a cyan filter, a yellow filter, and a magenta filter.

The blue perovskite photodiode 250*a*, the green perovskite photodiode 250*b*, and the red perovskite photodiode 250*c* may include the first perovskite photoelectric conversion layer 253 in common. For example, the blue perovskite photodiode 250*a*, the green perovskite photodiode 250*b*, and the red perovskite photodiode 250*c* may include separate, respective portions of a perovskite photoelectric conversion layer 253 which is a single, unitary piece of material. In addition, the first perovskite photoelectric conversion layer 253 may be configured to photoelectrically convert light passing through the first, second, and third wavelength selective filters 80*a*, 80*b*, and 80*c* according to regions (e.g., different regions of the single unitary piece of material of the perovskite photoelectric conversion layer 253 that are in different pixels 200 and thus overlap different wavelengths electric filters of the wavelength selective filter layer 80 in the vertical direction). For example, the first perovskite photoelectric conversion layer 253 included in the blue perovskite photodiode 250*a* (e.g., a limited portion of the single, unitary piece of material comprising the perovskite photoelectric conversion layer 253 that is in the blue pixel 200*a* and thus overlaps the first wavelength selective filter 80*a* in the vertical direction) may be configured to photoelectrically convert light of a blue wavelength spectrum (or light including a blue wavelength spectrum) that has passed through the first wavelength selective filter 80*a*, the first perovskite photoelectric conversion layer 253 included in the green perovskite photodiode 250*b* (e.g., a limited portion of the single, unitary piece of material comprising the perovskite photoelectric conversion layer 253 that is in the green pixel 200*b* and thus overlaps the second wavelength selective filter 80*b* in the vertical direction) may be configured to photoelectrically convert light of a green wavelength spectrum (or light including a green wavelength spectrum) that has passed through the second wavelength selective filter 80*b*, and the first perovskite photoelectric conversion layer 253 included in the red perovskite photodiode 250*c* (e.g., a limited portion of the single, unitary piece of material comprising the perovskite photoelectric conversion layer 253 that is in the red pixel 200*c* and thus overlaps the third wavelength selective filter 80*c* in the vertical direction) may be configured to photoelectrically convert light of a red wavelength spectrum (or light including a red wavelength spectrum) that has passed through the third wavelength selective filter 80*c*. Accordingly, the blue perovskite photodiode 250*a* may be configured to selectively sense light in the blue wavelength spectrum (or light including a blue wavelength spectrum), the green perovskite photodiode 250*b* may be configured to selectively sense light in the green wavelength spectrum (or light including a green wavelength spectrum), and the red perovskite photodiode 250*c* may be configured to selectively sense light in the red wavelength spectrum (or light including a red wavelength spectrum).

Charges (holes or electrons) generated by photoelectric conversion in the first perovskite photoelectric conversion layer 253 in the blue perovskite photodiode 250*a*, the green perovskite photodiode 250*b*, and the red perovskite photodiode 250*c* may move to the first electrodes 251*a*, 251*b*, and 251*c* and the second electrode 252, respectively, and the charges moved to the first electrodes 251*a*, 251*b*, and 251*c* may be collected in the charge storages 120*a*, 120*b*, and 120*c*.

The insulating layers 60 and 70 are disposed between the first perovskite photodiode 250 and the substrate 110 and between the first perovskite photodiode 250 and the wavelength selective filter layer 80, respectively. The insulating layers 60 and 70 may include an organic material, an inorganic material, an organic-inorganic material, or any combination thereof, and for example an inorganic insulating material such as a silicon oxide and/or a silicon nitride or a low dielectric constant (low K) material such as SiC, SiCOH, SiCO, and SiOF. At least one of the insulating layers 60 or 70 may be omitted.

The focusing lens 90 may be disposed on the first perovskite photodiode 250 and wavelength selective filter layer 80 to control the direction of the incident light and collect the light to one point. The focusing lens 90 may have, for example, a cylindrical shape or a hemispherical shape, but is not limited thereto. A planarization layer 85 may be optionally disposed between the focusing lens 90 and the wavelength selective filter layer 80. The planarization layer 85 may include an organic material, an inorganic material, an organic-inorganic material, or any combination thereof, and for example an inorganic insulating material such as a silicon oxide and/or a silicon nitride or a low dielectric constant (low K) material such as SiC, SiCOH, SiCO, and SiOF.

As described above, perovskite may have about 10 times or more (e.g., about 10 times to 1000 times) higher absorbance than silicon and thus higher light absorption characteristics than a conventional silicon photodiode. For example, a thickness of the perovskite photoelectric conversion layer 253 configured to absorb the same amount of light may be reduced to about 1/10 or less than a thickness of a conventional silicon photodiode, and thus, a thickness of the image sensor 300 may also be greatly reduced and may be effectively applied as a thin-type image sensor. As a result, an image sensor 300 may be configured to have improved compactness (e.g., improved miniaturization) without compromising photoelectric conversion efficiency, performance, and/or sensitivity of the image sensor 300 based on the image sensor including a perovskite photodiode 250 instead of a conventional silicon photodiode.

The first perovskite photoelectric conversion layer 253 may have a relatively thin thickness due to such high absorption characteristics, and may have a thickness, for example, about 100 nm to about 800 nm, about 100 nm to about 700 nm, about 100 nm to about 500 nm, or about 200 nm to about 500 nm.

As described above, the perovskite may determine a cut-off wavelength of an absorption spectrum according to an energy bandgap, and thus have wavelength selectivity. Accordingly, unlike silicon configured to absorb substantially uniformly light of a broad wavelength spectrum, for example, from short wavelength (near about 200 nm) to an infrared wavelength spectrum, without the wavelength selectivity, the first perovskite photoelectric conversion layer 253 may exclude light of the infrared wavelength spectrum but may be configured to absorb light of a visible wavelength spectrum without a separate infrared blocking filter. For example, an image sensor 300 may be configured to have improved compactness (e.g., improved miniaturization) based on not including any separate infrared blocking filter while maintaining wavelength selectivity (e.g., being configured to absorb visible light but not infrared light) based on the image sensor including a perovskite photodiode 250 instead of a conventional silicon photodiode.

In addition, the first perovskite photoelectric conversion layer 253 may have a refractive index of less than or equal to about 3.0, which may be lower than the refractive index of silicon (about 3.88@ 630 nm). Accordingly, since an interfacial reflectance of the first perovskite photoelectric conversion layer 253 with the air is less than about 30%, less than or equal to about 28%, or less than or equal to about 25% (e.g., about 23%) based on an incident angle of 0°, while an interfacial reflectance of silicon with the air is about 35%, the first perovskite photoelectric conversion layer 253 instead of the silicon may be used to condense more light into the first perovskite photoelectric conversion layer 253 or not to form a separate anti-reflection coating.

In addition, the perovskite, compared with an organic photoelectric conversion material, has about 1000 times or more (e.g., about 1000 times to about $10^6$ times) high charge mobility, and thus high photoelectric conversion efficiency and low remaining charges characteristics, in addition to the high light absorption characteristics. Accordingly, it may be effectively applied to high-performance image sensors such as high-speed driving sensors.

In addition, the perovskite may be applied to both solution processes such as spin coating, slit coating, and inkjet coating, and deposition processes such as vacuum deposition and thermal deposition, and thus it may have less process limitations.

Hereinafter, another example of an image sensor according to some example embodiments is described.

Figure 5:
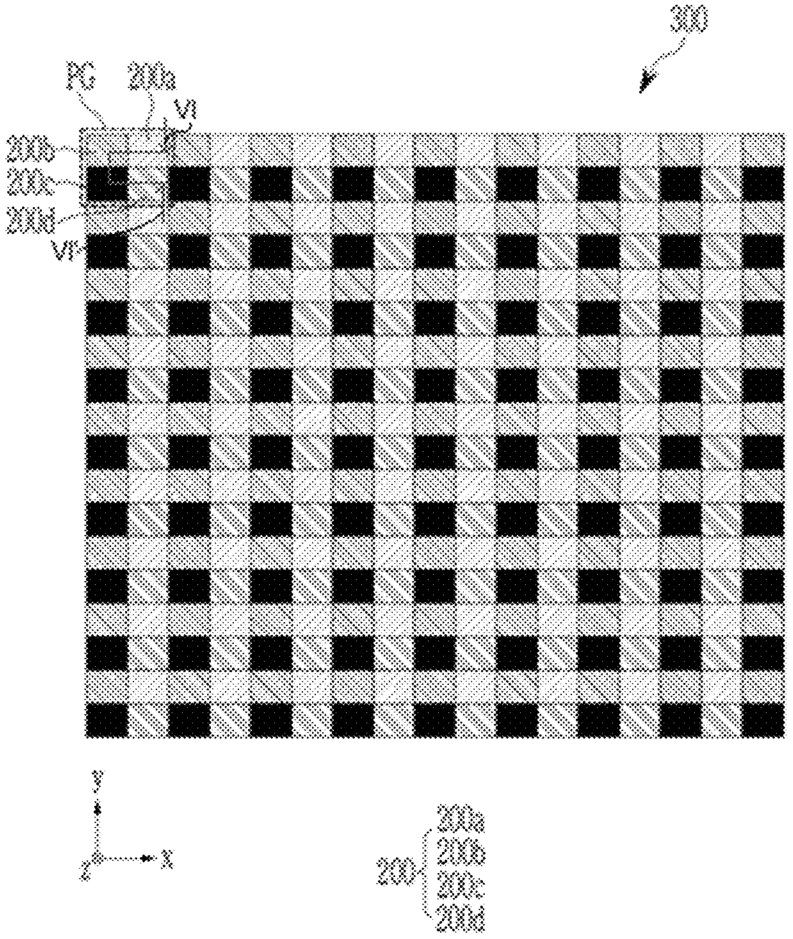
FIG. 5 is a plan view illustrating another example of an image sensor according to some example embodiments.
Figure 6:
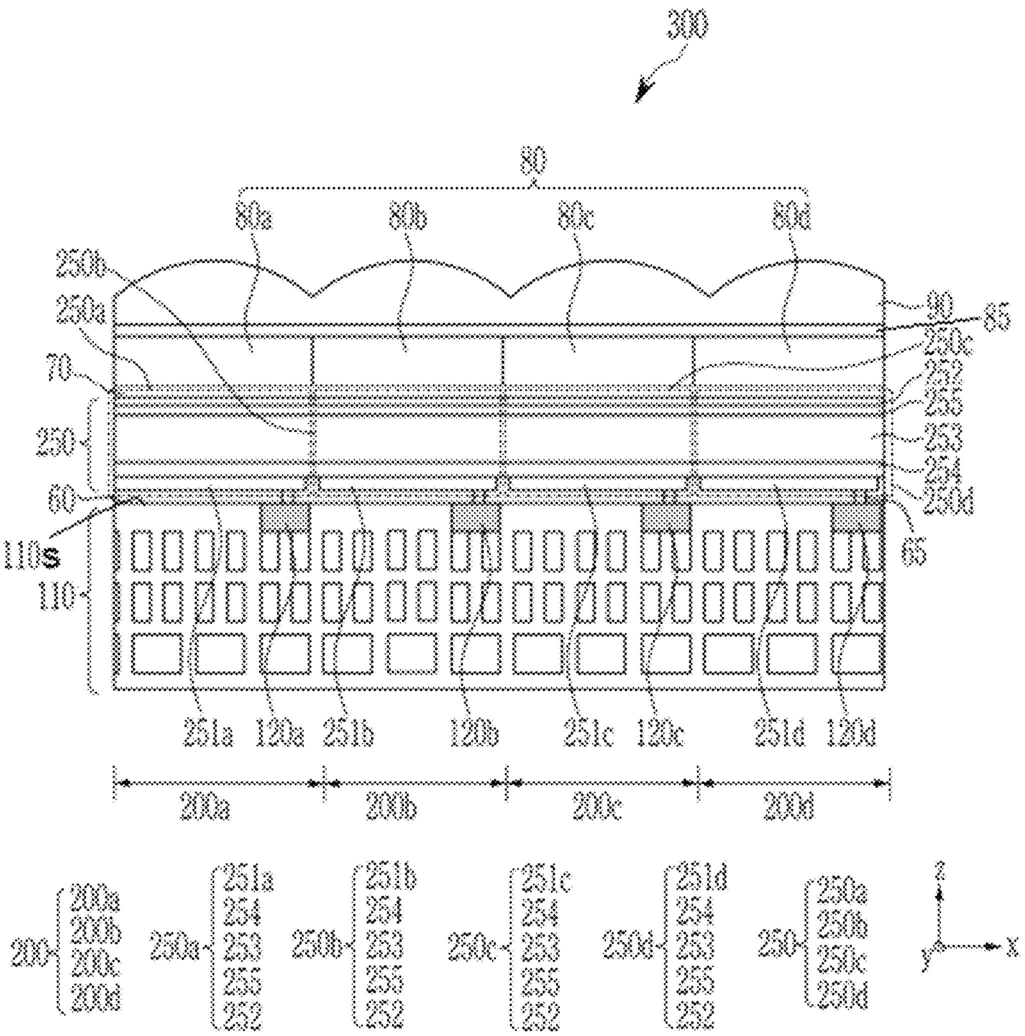
FIG. 6 is a cross-sectional view showing an example of the image sensor of FIG. 5 along cross-sectional view line VI-VI' of FIG. 5 according to some example embodiments.

FIG. 5 is a plan view showing another example of an image sensor according to some example embodiments, and FIG. 6 is a cross-sectional view showing an example of the image sensor of FIG. 5 along cross-sectional view line VI-VI' of FIG. 5 according to some example embodiments.

Referring to FIG. 5, an image sensor 300 according to an example of some example embodiments, like some example embodiments, including the example embodiments shown in FIG. 3, may include a plurality of pixels 200 respectively photoelectrically converting light of each first, second, and third wavelength spectrum belonging to a visible wavelength spectrum but differing one another, wherein each pixel 200 may be a blue pixel 200*a* configured to selectively sense light of a blue wavelength spectrum, a green pixel 200*b* configured to selectively sense light of a green wavelength spectrum, or a red pixel 200*c* configured to selectively sense light of a red wavelength spectrum.

In the image sensor 300 according to some example embodiments, including the example embodiments shown in FIG. 5, unlike some example embodiments, including the example embodiments shown in FIG. 3, the plurality of pixels 200 may further include an infrared pixel 200*d*. For example, one blue pixel 200*a*, one green pixel 200*b*, one red pixel 200*c*, and one infrared pixel 200*d* may form one pixel group PG and be repetitively arranged along rows and/or columns. The infrared pixel 200*d* may be configured to absorb and then photoelectrically convert at least a portion of light of an infrared wavelength spectrum.

Referring to FIG. 6, an image sensor 300 according to an example of some example embodiments include a substrate 110, a first perovskite photodiode 250, a wavelength selective filter layer 80, insulating layers 60 and 70, and a focusing lens 90, like some example embodiments, including the example embodiments shown in FIG. 3.

However, unlike some example embodiments, including the example embodiments shown in FIG. 3, the first perovskite photodiode 250 further includes an infrared perovskite photodiode 250*d* included in the infrared pixel 200*d* in addition to the blue perovskite photodiode 250*a* included in blue pixel 200*a*, the green perovskite photodiode 250*b* included in in the green pixel 200*b*, and the red perovskite photodiode 250*c* included in the red pixel 200*c*. The blue perovskite photodiode 250*a*, the green perovskite photodiode 250*b*, the red perovskite photodiode 250*c*, and the infrared perovskite photodiode 250*d* are arranged in an in-plane direction (e.g., xy direction) of the substrate 110 (e.g., parallel to the upper surface 110*s* of the substrate 110 to form a photodiode array.

The blue perovskite photodiode 250*a*, the green perovskite photodiode 250*b*, the red perovskite photodiode 250*c*, and the infrared perovskite photodiode 250*d* respectively include separate first electrodes of the first electrodes 251*a*, 251*b*, 251*c*, and 251*d*, separate portions of the second electrode 252 (which may be a single, unitary piece of material), separate portions of a first perovskite photoelectric conversion layer 253 (which may be a single, unitary piece of material) between the first electrodes 251*a*, 251*b*, 251*c*, and 251*d* and the second electrode 252, separate portions of a lower auxiliary layer 254 (which may be a single, unitary piece of material) between the first electrodes 251*a*, 251*b*, 251*c*, and 251*d* and the first perovskite photoelectric conversion layer 253 (which may be a single, unitary piece of material), and separate portions of an upper auxiliary layer 255 (which may be a single, unitary piece of material) between the second electrode 252 and the first perovskite photoelectric conversion layer 253.

The first perovskite photoelectric conversion layer 253 may include the aforementioned perovskite, and may be commonly included in the blue perovskite photodiode 250*a*, the green perovskite photodiode 250*b*, the red perovskite photodiode 250*c*, and the infrared perovskite photodiode 250*d*. For example, the blue perovskite photodiode 250*a*, the green perovskite photodiode 250*b*, the red perovskite photodiode 250*c*, and the infrared perovskite photodiode 250*d* may include separate, respective portions of the perovskite photoelectric conversion layer 253 which is a single, unitary piece of material. In some example embodiments, including the example embodiments shown in FIGS. 5-6, the perovskite included in the first perovskite photoelectric conversion layer 253 may be configured to absorb light ranging from a visible wavelength spectrum to an infrared wavelength spectrum.

For example, the absorption spectrum of the perovskite may have a relatively high absorbance from a short wavelength (e.g., a wavelength belonging to an X-ray or UV-ray region) to an infrared wavelength spectrum. The perovskite may have an energy bandgap that matches the infrared wavelength spectrum.

For example, the cut-off wavelength of the absorption spectrum of the perovskite may be an end-point of the infrared wavelength spectrum to be photoelectrically converted by the infrared perovskite photodiode 250*d*, and may belong to, for example, about 800 nm to about 3000 nm, within the above range, about 800 nm to about 2500 nm, about 800 nm to about 2200 nm, about 800 nm to about 2000 nm, about 800 nm to about 1800 nm, about 800 nm to about 1500 nm, about 800 nm to about 1300 nm, about 900 nm to about 2500 nm, about 900 nm to about 2200 nm, about 900 nm to about 2000 nm, about 900 nm to about 1800 nm, about 900 nm to about 1500 nm, about 900 nm to about 1300 nm, about 1000 nm to about 2500 nm, about 1000 nm to about 2200 nm, about 1000 nm to about 2000 nm, about 1000 nm to about 1800 nm, about 1000 nm to about 1500 nm, or about 1000 nm to about 1300 nm.

The wavelength selective filter layer 80 may include a first wavelength selective filter 80*a* included in the blue pixel 200*a*, a second wavelength selective filter 80*b* included in the green pixel 200*b*, and a third wavelength selective filter 80*c* included in the red pixel 200*c*, and additionally, an infrared filter 80*d* included in an infrared pixel 200*d*.

As described above, the first, second, and third wavelength selective filters 80*a*, 80*b*, and 80*c* may differ from one another, and the first wavelength selective filter 80*a* may be a blue filter, a cyan filter, or a magenta filter, the second wavelength selective filter 80*b* may be a green filter, a cyan filter, or a yellow filter, and the third wavelength selective filter 80*c* may be a red filter, a yellow filter, or a magenta filter. For example, the first, second, and third wavelength selective filters 80*a*, 80*b*, and 80*c* may be a blue filter, a green filter, and a red filter, respectively. For example, the first, second, and third wavelength selective filters 80*a*, 80*b*, and 80*c* may be a cyan filter, a yellow filter, and a magenta filter.

The infrared filter 80*d*, overlapping the infrared perovskite photodiode 250*d* in the vertical direction as shown, may be configured to selectively transmit light of a particular (or, alternatively, predetermined) infrared wavelength spectrum, and for example, may be configured to selectively transmit light of an infrared wavelength spectrum to be photoelectrically converted by the infrared perovskite photodiode 250*d*. The infrared filter 80*d* may be configured to selectively transmit light of a wavelength spectrum of, for example, greater than about 750 nm and less than or equal to about 3000 nm, within the above range, about 750 nm to about 3000 nm, about 750 nm to about 2500 nm, about 750 nm to about 2000 nm, about 750 nm to about 1800 nm, about 750 nm to about 1500 nm, about 800 nm to about 3000 nm, about 800 nm to about 2500 nm, about 800 nm to about 2000 nm, about 800 nm to about 1800 nm, or about 800 nm to about 1500 nm, but is not limited thereto.

The image sensor 300 according to some example embodiments, including the example embodiments shown in FIGS. 5-6, additionally includes an infrared pixel 200*d* in addition to the image sensor 300 according to some example embodiments, including the example embodiments shown in FIGS. 3-4, and thereby thus sensitivity in a low-light environment may be improved, and an ability to sense a three-dimensional image may be effectively improved by widening the dynamic range for detailed distinction between black and white contrast. In addition, the image sensor 300 may additionally include an infrared pixel and have a function of a security sensor, a vehicle sensor, or a biometric sensor.

Hereinafter, another example of an image sensor according to some example embodiments is described.

Figure 7:
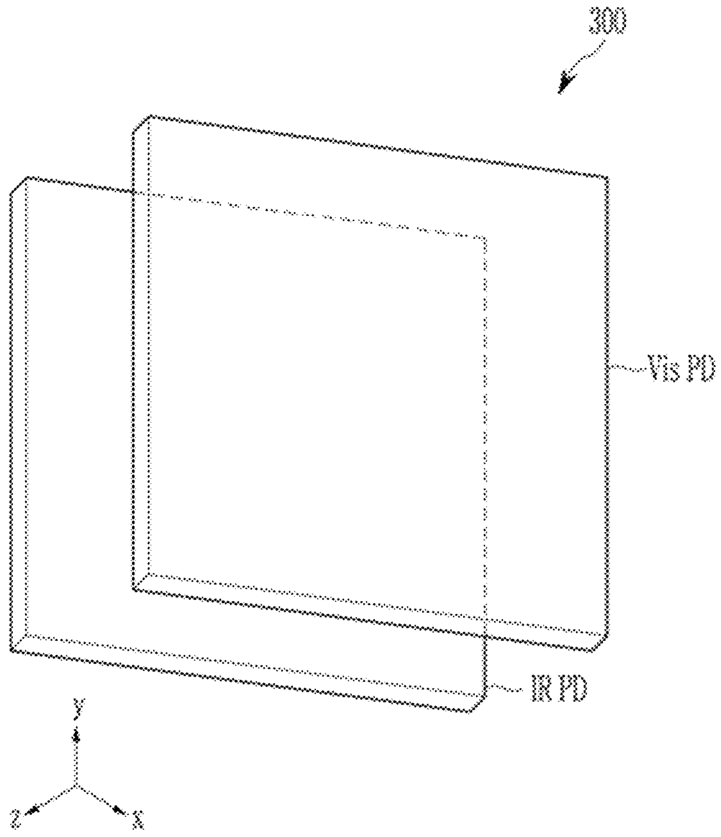
FIG. 7 is a perspective view showing another example of an image sensor according to some example embodiments.
Figure 8:
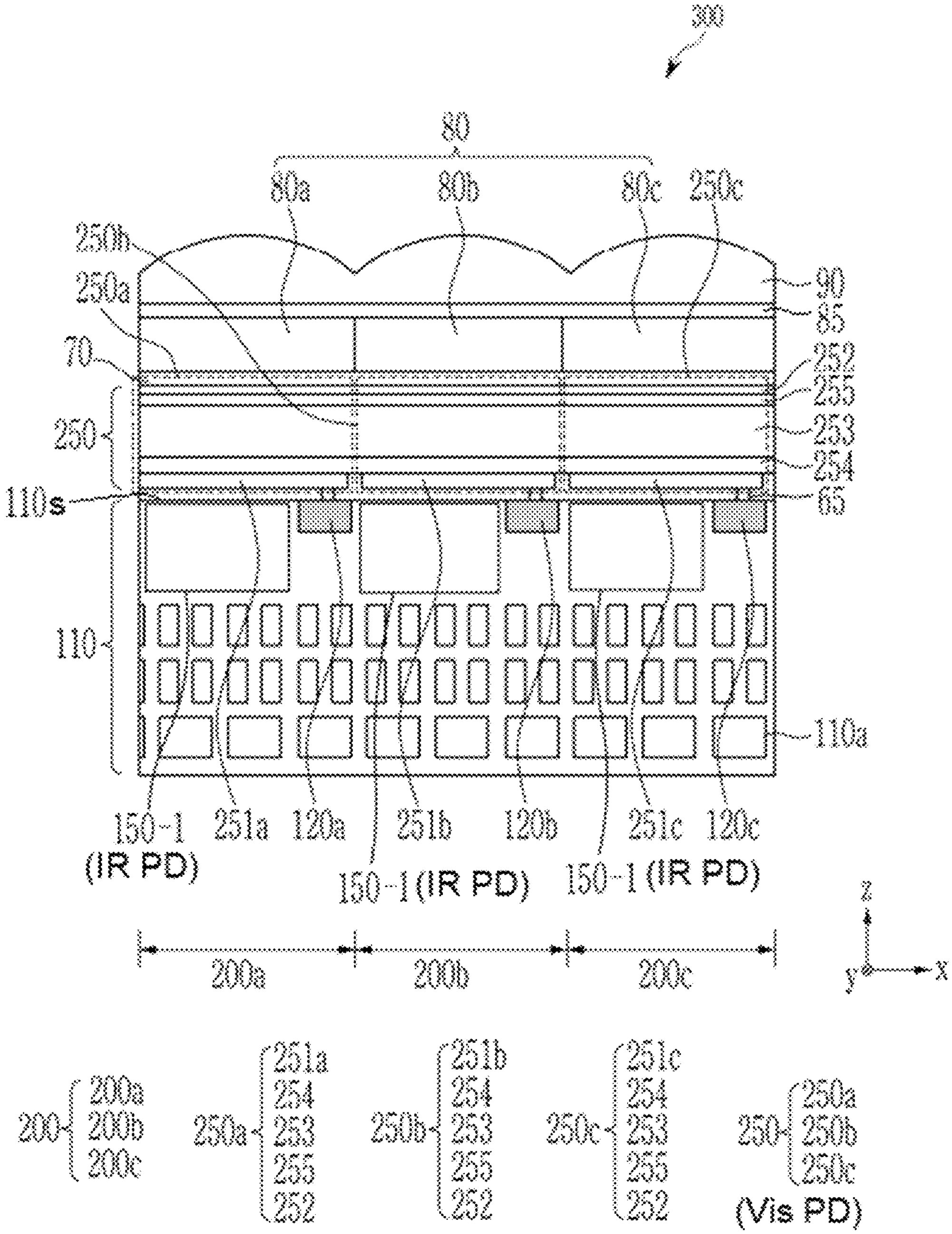
FIG. 8 is a cross-sectional view showing an example of the image sensor of FIG. 7 according to some example embodiments.

FIG. 7 is a perspective view showing another example of an image sensor according to some example embodiments, and FIG. 8 is a cross-sectional view showing an example of the image sensor of FIG. 7 according to some example embodiments.

Referring to FIG. 7, the image sensor 300 according to some example embodiments includes a visible photodiode Vis PD configured to absorb light of a visible wavelength spectrum and an infrared photodiode IR PD configured to sense light of an infrared wavelength spectrum. The visible photodiode Vis PD may be disposed on the infrared photodiode IR PD, and the visible photodiode Vis PD may be disposed closer to the side where light is incident than the infrared photodiode IR PD. Accordingly, incident light may pass through the visible photodiode Vis PD and be introduced into the infrared photodiode IR PD. The visible photodiode Vis PD and the infrared photodiode IR PD are stacked along an incident direction of light. The visible photodiode Vis PD may include a first perovskite photodiode 250 configured to sense light in the visible wavelength spectrum.

Referring to FIG. 8, the image sensor 300 includes a substrate 110, a first perovskite photodiode 250, a wavelength selective filter layer 80, a silicon photodiode 150-1, insulating layers 60 and 70, and a focusing lens 90.

The substrate 110, the wavelength selective filter layer 80, the insulating layers 60 and 70, and the focusing lens 90 are the same as described above.

The first perovskite photodiode 250 may be the visible photodiode Vis PD of FIG. 7. The cut-off wavelength of the absorption spectrum of the perovskite included in the first perovskite photoelectric conversion layer 253 may be a boundary point between the visible wavelength spectrum and the infrared wavelength spectrum, and for example, may be greater than about 650 nm and less than about 750 nm, within the above range, about 670 nm to about 730 nm, about 680 nm to about 720 nm, or about 690 nm to about 710 nm. Accordingly, the first perovskite photoelectric conversion layer 253 may be configured to absorb light of a visible wavelength spectrum and transmit light of an infrared wavelength spectrum.

The silicon photodiode 150-1 may be an infrared photodiode IR PD of FIG. 7 and may be integrated into the substrate 110, for example such that the silicon photodiode 150-1 is partially or entirely within a volume space defined by outermost surfaces of the substrate 110 (e.g., upper surface 110*s*). The substrate 110 may be a CMOS substrate. The silicon photodiode 150-1 may be formed to a depth and thickness capable of absorbing infrared wavelength spectrum light within the substrate 110. For example, the thickness of the silicon photodiode 150-1 may be about 1 μm to about 10 μm, and within the above range, about 2 μm to about 8 μm, or about 2 μm to about 6 μm.

As shown, the infrared photodiode IR PD (e.g., the silicon photodiode 150-1) may be stacked with the first perovskite photodiode 250. Since the silicon photodiode 150-1 is disposed under the aforementioned wavelength selective filter layer 80 and the first perovskite photodiode 250 to sense light passing through the wavelength selective filter layer 80 and the first perovskite photodiode 250, although the absorption spectrum of silicon widely spans from the short wavelength to the infrared wavelength spectrum, it may exclude the light of the short wavelength to the visible wavelength spectrum and selectively absorb the light of the infrared wavelength spectrum to photoelectrically convert the light of the infrared wavelength spectrum. For example, the transmittance of the infrared wavelength spectrum of the first perovskite photodiode 250 may be about 80% to about 100%, within the above range, about 85% to about 100%, about 90% to about 100%, and about 95% to about 100%, about 97% to about 100%, about 98% to about 100%, or about 99% to about 100%.

The image sensor 300 according to some example embodiments, including the example embodiments shown in FIGS. 7-8, may be a stacked image sensor in which a first perovskite photodiode 250 and a silicon photodiode 150-1 which are configured to sense light of different wavelength spectrums are stacked. Accordingly, an in-pixel image sensor that realizes an image by simultaneously sensing light in the visible region and light in the infrared region within one pixel may be implemented. Therefore, unlike the structure in which the first perovskite photodiode 250 and the silicon photodiode 150-1 are manufactured on separate substrates, sensitivity in a low-light environment may be improved without increasing the size of the image sensor 300, and by widening a dynamic range that separates black and white details, sensing ability of a 3D image may be effectively increased.

In addition, the silicon photodiode 150-1 may be used as a security sensor, a vehicle sensor, or a biometric sensor, and may be used as a composite sensor having composite functions of an image sensor, a security sensor, a vehicle sensor, or a biometric sensor due to the aforementioned stacked structure of the first perovskite photodiode 250 and silicon photodiode 150-1. Here, the biometric sensor may be, for example, an iris sensor, a distance sensor, a fingerprint sensor, or a blood vessel distribution sensor, but is not limited thereto.

Hereinafter, another example of an image sensor according to some example embodiments is described.

Figure 9:
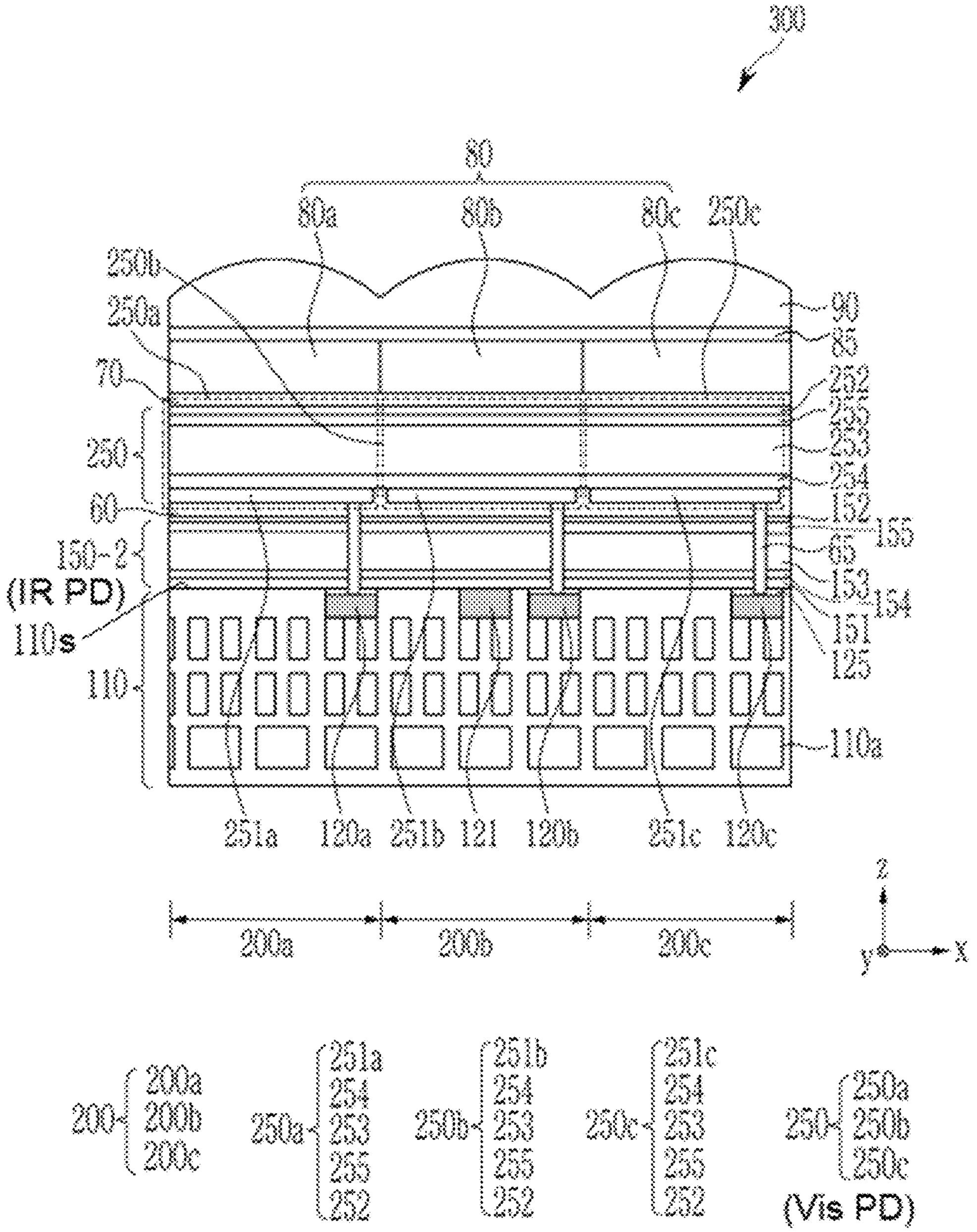
FIG. 9 is a cross-sectional view showing another example of the image sensor of FIG. 7 according to some example embodiments.

FIG. 9 is a cross-sectional view showing another example of the image sensor of FIG. 7 according to some example embodiments.

Referring to FIG. 9, the image sensor 300 according to some example embodiments includes a substrate 110, a first perovskite photodiode 250, a wavelength selective filter layer 80, and a second perovskite photodiode 150-2, insulating layers 60 and 70, and a focusing lens 90.

The substrate 110, the first perovskite photodiode 250, the wavelength selective filter layer 80, the insulating layers 60 and 70, and the focusing lens 90 are the same as described above.

The second perovskite photodiode 150-2 may be an infrared photodiode IR PD of FIG. 7 and may be disposed on the substrate 110. The second perovskite photodiode 150-2 may be disposed at the front surface of the substrate 110 and is stacked with the first perovskite photodiode 250 in each pixel 200*a*, 200*b*, and 200*c*.

The second perovskite photodiode 150-2 may be configured to sense light of a longer wavelength spectrum than the first perovskite photodiode 250, that is, light of at least a portion of the infrared wavelength spectrum. The second perovskite photodiode 150-2 includes a third electrode 151, a fourth electrode 152, a second perovskite photoelectric conversion layer 153 between the third electrode 151 and the fourth electrode 152, a lower auxiliary layer 154 between the third electrode 151 and the second perovskite photoelectric conversion layer 153, and an upper auxiliary layer 155 between the fourth electrode 152 and the second perovskite photoelectric conversion layer 153.

One of the third electrode 151 or the fourth electrode 152 may be an anode and the other may be a cathode. For example, the third electrode 151 may be an anode and the fourth electrode 152 may be a cathode. For example, the third electrode 151 may be a cathode and the fourth electrode 152 may be an anode. The third electrode 151 may be, for example, a light transmitting electrode or a reflective electrode. The fourth electrode 152 may be, for example, a light transmitting electrode, and a description of the light transmitting electrode is as described above. The third electrode 151 may be electrically connected to the charge storage 121 integrated on the substrate 110, and the fourth electrode 152 may be an incident electrode in a direction in which light passing through the wavelength selective filter layer 80 and the first perovskite photoelectric conversion layer 253 is incident. The third electrode 151 and the fourth electrode 152 may each independently have a same material composition as one or both of the first electrode 251 or the second electrode 252.

The second perovskite photoelectric conversion layer 153 may include a perovskite (hereinafter, referred to as 'second perovskite') that is different from the aforementioned perovskite included in the first perovskite photoelectric conversion layer 253, that is first perovskite. The second perovskite may be a Pb-free perovskite.

The second perovskite may be configured to absorb light of at least a portion of the infrared wavelength spectrum, and the infrared wavelength spectrum may include a portion or all of the near-infrared, short-wave infrared, mid-wave infrared, and far-infrared wavelength spectrum, for example greater than about 750 nm and less than or equal to about 3000 nm, within the above range, greater than about 750 nm and less than or equal to about 2500 nm, greater than about 750 nm and less than or equal to about 2000 nm, greater than about 750 nm and less than or equal to about 1800 nm, greater than about 750 nm and less than or equal to about 1500 nm, about 800 nm to about 3000 nm, about 800 nm to about 2500 nm, about 800 nm to about 2000 nm, about 800 nm to about 1800 nm, or about 800 nm to about 1500 nm, but is not limited thereto.

For example, the absorption spectrum of the second perovskite may have a relatively high absorbance from a short wavelength (e.g., a wavelength belonging to an X-ray or UV-ray region) to an infrared wavelength spectrum. The second perovskite may have an energy bandgap that matches the infrared wavelength spectrum.

For example, the cut-off wavelength of the absorption spectrum of the second perovskite may be the end-point of the infrared wavelength spectrum to be photoelectrically converted and may be a longer wavelength than the cut-off wavelength of the absorption spectrum of the aforementioned first perovskite. For example, the cut-off wavelength of the absorption spectrum of the second perovskite may belong to, for example, about 800 nm to about 3000 nm, and within the above range, about 800 nm to about 2500 nm, about 800 nm to about 2200 nm, about 800 nm to about 2000 nm, about 800 nm to about 1800 nm, about 800 nm to about 1500 nm, about 800 nm to about 1300 nm, about 900 nm to about 2500 nm, about 900 nm to about 2200 nm, about 900 nm to about 2000 nm, about 900 nm to about 1800 nm, about 900 nm to about 1500 nm, about 900 nm to about 1300 nm, about 1000 nm to about 2500 nm, about 1000 nm to about 2200 nm, about 1000 nm to about 2000 nm, about 1000 nm to about 1800 nm, about 1000 nm to about 1500 nm, or about 1000 nm to about 1300 nm.

Charges (holes or electrons) generated by photoelectric conversion in the second perovskite photoelectric conversion layer 153 may move to the third electrode 151 and the fourth electrode 152, respectively, and the charges moved to the third electrode 151 may be collected in the charge storage 121.

The lower auxiliary layer 154 may be the same as (e.g., may have the same material composition as) the aforementioned lower auxiliary layer 254, and the upper auxiliary layer 155 may be the same as (e.g., may have the same material composition as) the aforementioned upper auxiliary layer 255. For example, the lower auxiliary layer 154 may include a compound represented by Chemical Formula 1.

Since the second perovskite photodiode 150-2 is disposed under the aforementioned wavelength selective filter layer 80 and the first perovskite photodiode 250 to sense light passing through the wavelength selective filter layer 80 and the first perovskite photodiode 250, although the absorption spectrum of the second perovskite widely spans from the short wavelength to the infrared wavelength spectrum, it may exclude the light of the short wavelength to the visible wavelength spectrum and selectively absorb the light of the infrared wavelength spectrum to photoelectrically convert the light of the infrared wavelength spectrum. For example, the transmittance of the infrared wavelength spectrum of the first perovskite photodiode 250 may be about 80% to about 100%, within the above range, about 85% to about 100%, about 90% to about 100%, and about 95% to about 100%, about 97% to about 100%, about 98% to about 100%, or about 99% to about 100%. Due to the second perovskite photodiode 150-2, the substrate 110 may not include a separate silicon photodiode (e.g., may not include any silicon photodiodes integrated therein).

The aforementioned image sensors may be included in an imaging device such as a camera, and such an image sensor and/or camera may be for example applied to various electronic devices such as a smartphone, a mobile phone, a tablet PC, a laptop PC, a desktop PC, an e-book, a navigation device, TV, PDA (personal digital assistant), PMP (portable multimedia player), EDA (enterprise digital assistant), a wearable computers, Internet of Things devices (IoT), Internet of Things (IoE), a drone, a digital camera, a door lock, a safe, automated teller machines (ATMs), a security device, a medical device, or automotive electronic components.

Figure 10:
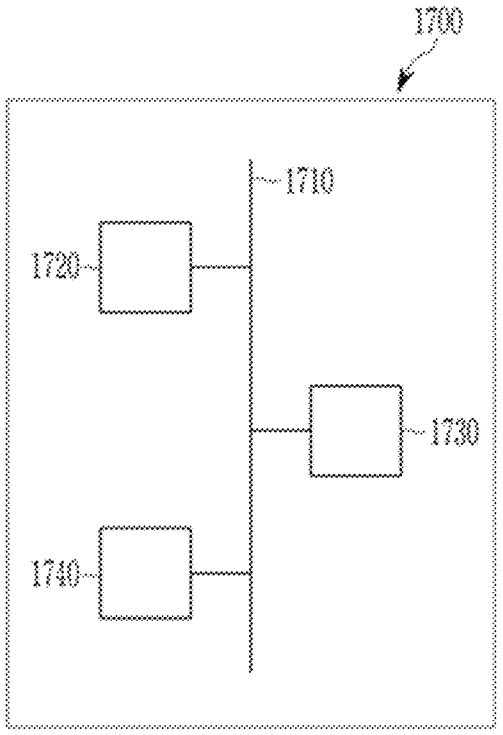
FIG. 10 is a schematic diagram of an electronic device according to some example embodiments.

FIG. 10 is a schematic diagram of an electronic device according to some example embodiments.

Referring to FIG. 10, an electronic device 1700 may include a processor 1720, a memory 1730, and an image sensor 1740 electrically connected to each other through a bus 1710. The image sensor 1740 may be the same as described above (e.g., may be any image sensor 300 according to any of the example embodiments). The memory 1730, which may be a non-transitory computer readable medium, may store a program of instructions. The processor 1720 may execute the stored program of instructions to perform one or more functions. For example, the processor 1720 may be configured to process electrical signals generated by the image sensor 1740. The processor 1720 may be configured to generate an output (e.g., an image to be displayed on a display interface) based on processing electrical signals generated by the image sensor 1740.

The processor 1720 may include one or more articles of processing circuitry such as a hardware including logic circuits; a hardware/software combination such as processor-implemented software; or any combination thereof. For example, the processing circuitry may be a central processing unit (CPU), an arithmetic logic unit (ALU), a digital signal processor, a microcomputer, a field programmable gate array (FPGA), System-on-Chip (SoC), a programmable logic unit, a microprocessor, an application-specific integrated circuit (ASIC), and the like. As an example, the processing circuitry may include a non-transitory computer readable storage device. The processor 1720 may control, for example, a display operation of a display panel of the electronic device 1700 or a sensor operation of the image sensor 1740.

The memory 1730 may store an instruction program, and the processor 1720 may perform a function of the electronic device 1700 by executing the stored instruction program.

The units and/or modules described herein may be implemented using hardware constituent elements and software constituent elements. For example, the hardware constituent elements may include microphones, amplifiers, band pass filters, audio-to-digital converters, and processing devices. The processing device may be implemented using one or more hardware devices configured to perform and/or execute program code by performing arithmetic, logic, and input/output operations. The processing device may include a processor, a controller and an arithmetic logic unit, a digital signal processor, a microcomputer, a field programmable array, a programmable logic unit, a microprocessor, or any other device capable of responding to and executing instructions. The processing device may access, store, operate, process, and generate data in response to execution of an operating system (OS) and one or more software running on the operating system.

The software may include a computer program, a code, an instruction, or any combination thereof, and may transform a processing device for a special purpose by instructing and/or configuring the processing device independently or collectively to operate as desired. The software and data may be implemented permanently or temporarily as signal waves capable of providing or interpreting instructions or data to machines, parts, physical or virtual equipment, computer storage media or devices, or processing devices. The software may also be distributed over networked computer systems so that the software may be stored and executed in a distributed manner. The software and data may be stored by one or more non-transitory computer readable storage devices.

The method according to any of the foregoing example embodiments may be recorded in a non-transitory computer readable storage device including program instructions for implementing various operations of the aforementioned embodiments. The storage device may also include program instructions, data files, data structures, and the like alone or in combination. The program instructions recorded in the storage device may be specially designed for some example embodiments or may be known to those skilled in computer software and available for use. Examples of non-transitory computer-readable storage devices may include magnetic media such as hard disks, floppy disks, and magnetic tapes; optical media such as CD-ROM discs, DVDs and/or blue-ray discs; magneto-optical media such as optical disks; and a hardware device configured to store and execute program instructions such as ROM, RAM, flash memory, and the like. The aforementioned device may be configured to operate as one or more software modules to perform the operations of any of the aforementioned embodiments.

Hereinafter, some example embodiments are illustrated in more detail with reference to examples. However, the present scope of the inventive concepts is not limited to these examples.

Preparation Example: Preparation of Perovskite Precursor 0.89 mmol of formamidinium iodide (FAI), 0.01 mmol of ethylenediammonium diiodide ($EDAI_2$) and 0.9 mmol of $SnI_2$ are added to 1 ml of a mixed solvent of dimethyl formamide (DMF) and dimethylsulfoxide (DMSO) (DMF: DMSO=4:1, a volume ratio) and then, stirred under a nitrogen atmosphere at room temperature for 2 hours, preparing a perovskite precursor solution.

Synthesis Example: Synthesis of Compound for Auxiliary Layer (1) Synthesis of Compound 1

[Reaction Scheme 1]

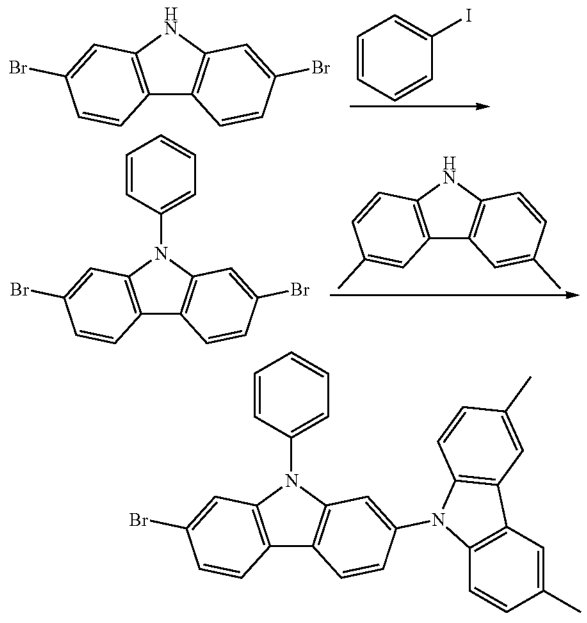

1 i) Synthesis of Intermediate 1

3.08 g (9.47 mmol) of 2,7-dibromo-9H-carbazole and 2.32 g (11.37 mmol) of iodobenzene are dissolved in 50 ml of anhydrous toluene and then, heated under reflux under the presence of 10 mol % of $Pd(dba)_2$, 20 mol % of $P(t-Bu)_3$, and 2.73 g (28.42 mmol) of sodium t-butoxide (NaOtBu) for 8 hours. After removing organic solvents, the obtained product is separated and purified through silica gel column chromatography, obtaining 3.27 g of 2,7-dibromo-9-phenyl-9H-carbazole (Intermediate 1). A yield is 86%.

ii) Synthesis of Compound 1

3.27 g (8.15 mmol) of Intermediate 1 and 1.91 g (9.78 mmol) of 3,6-dimethyl-9H-carbazole are dissolved in 50 ml of anhydrous toluene and then, heated under reflux under the presence of 10 mol % of $Pd(dba)_2$, 20 mol % of $P(t-Bu)_3$, and 2.35 g (24.44 mmol) of sodium t-butoxide (NaOtBu) for 8 hours. After removing organic solvents, the obtained product was separated and purified through silica gel column chromatography, obtaining 3.53 g of 7-bromo-3',6'-dimethyl-9-phenyl-9H-2,9'-bicarbazole (Compound 1). A yield is 84%.

(2) Synthesis of Compound 2

[Reaction Scheme 2]

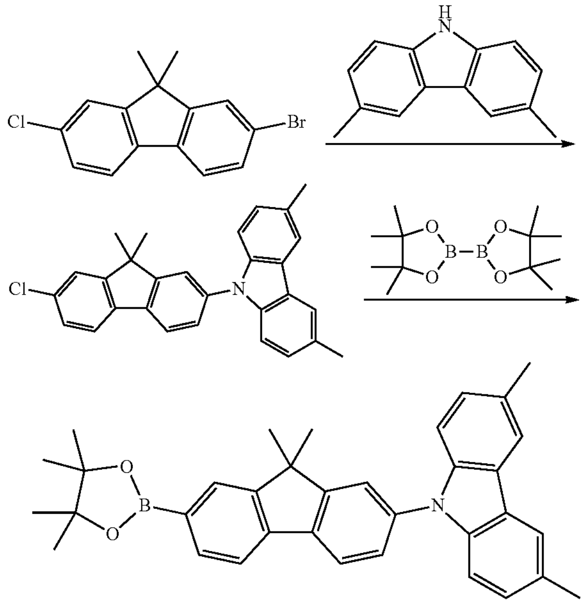

2 i) Synthesis of Intermediate 2

3.28 g (10.66 mmol) of 2-bromo-7-chloro-9,9-dimethyl-9H-fluorene and 2.50 g (12.80 mmol) of 3,6-dimethyl-9H-carbazole are dissolved in 50 ml of anhydrous toluene and then, heated under reflux under the presence of 10 mol % of $Pd(dba)_2$, 20 mol % of $P(t-Bu)_3$, and 3.08 g (31.99 mmol) of sodium t-butoxide (NaOtBu) for 8 hours. After removing organic solvents, the obtained product is separated and purified through silica gel column chromatography, obtaining 3.98 g of 9-(7-chloro-9,9-dimethyl-9H-fluoren-2-yl)-3,6-dimethyl-9H-carbazole (Intermediate 2). A yield is 88%.

ii) Synthesis of Compound 2

3.12 g (7.40 mmol) of Intermediate 2 and 2.01 g (8.14 mmol) of 4,4,4',4',5,5,5',5'-octamethyl-2,2'-bi(1,3,2-dioxaborolane) are dissolved in 30 ml of dioxane, and 2.18 g (22.20 mmol) of potassium acetate is added thereto and then, heated under reflux for 12 hours. When a reaction is completed, after extraction with methylenechloride (MC) and $H_2O$, an extract therefrom is separated and purified through silica gel column chromatography, obtaining 3.10 g of 9-(9,9-dimethyl-7-(4,4,5,5-tetramethyl-1,3,2-dioxaborolan-2-yl)-9H-fluoren-2-yl)-3,6-dimethyl-9H-carbazole (Compound 2). A yield is 82%.

(3) Synthesis of Compound 3

2.51 g (4.87 mmol) of Compound 1, 2.50 g (4.87 mmol) of Compound 2, 0.281 g (0.24 mmol) of $Pd(PPh_3)_4$, and 2.02 g (14.6 mmol) of $K_2CO_3$ are dissolved in 50 ml of $THF/H_2O$ (a volume ratio of 2:1) and then, heated under reflux at 80° C. for 12 hours. Subsequently, after extraction with water and ethylether, the obtained product is separated and purified through silica gel column chromatography, obtaining 3.23 g of 7-(7-(3,6-dimethyl-9H-carbazol-9-yl)-9,9-dimethyl-9H-fluoren-2-yl)-3',6'-dimethyl-9-phenyl-9H-2,9'-bicarbazole (Compound 3). A yield is 81%.

[Compound 3]

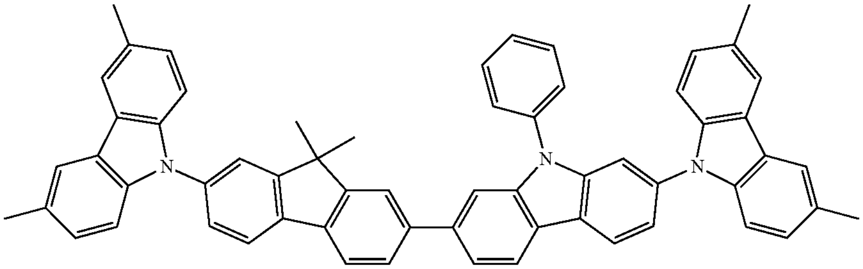

[Reaction Scheme 3]

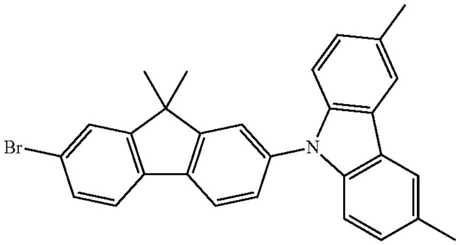

1

+

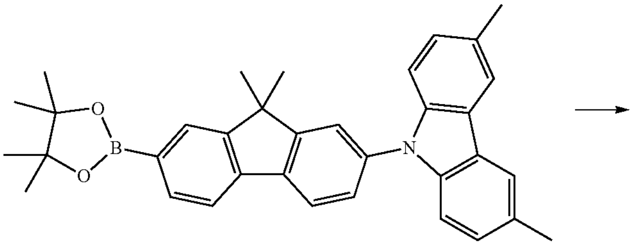

2

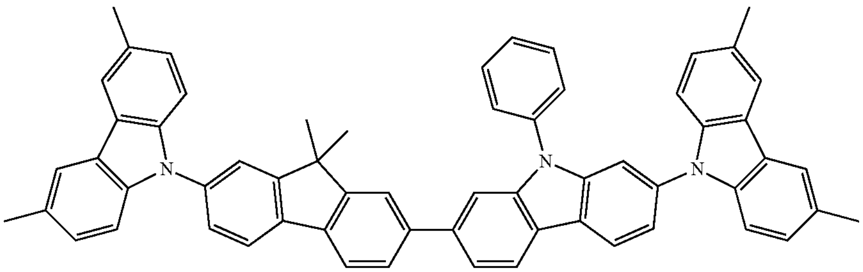

3

$^1H$ NMR (500 MHz, CDCl3): δ 8.35 (d, 1H), 8.30 (d, 1H), 7.95-7.91 (m, 4H), 7.85 (d, 1H), 7.76 (s, 1H), 7.71-7.69 (m, 3H), 7.67-7.59 (m, 6H), 7.56-7.53 (m, 2H), 7.50-7.45 (m, 2H), 7.38 (d, 2H), 7.34 (d, 2H), 7.26-7.20 (m, 4H), 2.57 (s, 6H), 2.55 (s, 6H), 1.61 (s, 6H)

Evaluation I

Compound 3 obtained by Synthesis Example is evaluated with respect to energy levels.

A HOMO energy level is evaluated by using AC-3 (Riken Keiki Co., LTD.) to irradiate a thin film with UV light and then, measure an amount of photoelectrons emitted according to energy, and a LUMO energy level is evaluated by obtaining an energy bandgap by a UV-Vis spectrometer (Shimadzu Corporation) and using this energy bandgap and the HOMO energy level.

The results are shown in Table 1.

TABLE 1

| | HOMO (eV) | LUMO (eV) | Eg (eV) |
|---|---|---|---|
| Compound 3 | 5.62 | 2.61 | 3.01 |

* HOMO, LUMO: absolute value
* Eg: energy bandgap

Evaluation II

Heat resistance properties of the compounds obtained by Synthesis Examples are evaluated.

The heat resistance properties are evaluated from a weight loss according to a temperature increase under high vacuum of less than or equal to 10 Pa, and each temperature where 10 wt % and 50 wt % of a weight relative to an initial weight are respectively lost is described as $Ts_{10}$ and $Ts_{50}$.

A glass transition temperature Tg and a crystallization temperature Tc are measured by using a differential scanning calorimeter DSC (Model name: Discovery DSC, Manufacturer: TA Instruments).

A melting point Tm is measured through differential thermal analysis DTA (Model name: TG-DTA2000SE, Manufacturer: NETZSCH) under a normal pressure.

Single-film heat resistance is evaluated by depositing a compound into a 30 nm-thick single film on an Si wafer and examining the film with an optical electron microscope OEM to obtain a highest temperature where single-film crystallization does not proceed.

The results are shown in Table 2.

TABLE 2

| | Compound 3 |
|---|---|
| Glass transition temperature (Tg) (° C.) | 200.1 |
| Crystallization temperature (Tc) (° C.) | 281.4 |
| Melting temperature (Tm) (° C.) | 298 |
| $T_{s10}$ (° C.) | 342 |
| $T_{s50}$ (° C.) | 372 |
| Single-film heat resistance (° C.) | 200 |

* $T_{s10}$: a temperature where a weight loss by 10 wt % of the initial weight
* $T_{s50}$: a temperature where a weight loss by 50 wt % of the initial weight Manufacture of Photodiodes Example 1

ITO is deposited on a glass substrate to form a 100 nm-thick lower electrode (work function: 4.6 to 4.7 eV). Subsequently, on the lower electrode, Compound 3 obtained by Synthesis Example is deposited to form a 5 nm-thick lower auxiliary layer (HOMO: 5.62 eV, LUMO: 2.61 eV). Subsequently, on the lower auxiliary layer, the perovskite precursor solution of Preparation Example is spin-coated at 8000 rpm for 60 seconds and annealed at 80° C. for 15 minutes to form a perovskite photoelectric conversion layer including Pb-free perovskite represented by $FA_{0.99}EDA_{0.01}SnI_3$. Then, on the perovskite photoelectric conversion layer, fullerene C60 with 20 nm, BCP with 4 nm, and Ag with 100 nm are sequentially thermally deposited at about 0.1 to 0.3 Å/s under high vacuum ($<3.0\times10^{-6}$ Torr) to form an upper auxiliary layer and an upper electrode, manufacturing a photodiode.

Example 2

A photodiode is manufactured in the same manner as in Example 1 except that a 10 nm-thick first lower auxiliary layer formed by depositing Compound 3 obtained by Synthesis Example and a 20 nm to 30 nm-thick second lower auxiliary layer formed by spin coating PEDOT: PSS are used instead of the lower auxiliary layer formed by depositing Compound 3 obtained by Synthesis Example.

Comparative Example

A photodiode is manufactured in the same manner as in Example 1 except that a 20 nm to 30 nm-thick lower auxiliary layer is formed by spin coating PEDOT:PSS instead of the lower auxiliary layer formed by depositing Compound 3 obtained by Synthesis Example.

Evaluation III

Photoelectric conversion efficiency of the photodiodes according to Example 1 and the Comparative Example are evaluated.

The photoelectric conversion efficiency is evaluated from external quantum efficiency (EQE), and the external quantum efficiency (EQE) is measured by applying a reverse bias voltage of −1 V to the photodiodes for an absorption wavelength (λ) 400 to 1000 nm in an Incident Photon to Current Efficiency (IPCE) method and then, compared and evaluated, based on external quantum efficiency (EQE) at an absorption wavelength of 530 nm.

The results are shown in Table 3.

TABLE 3

| | EQE (%, @ −1 V, 530 nm) |
|---|---|
| Example 1 | 84 |
| Comparative Example | 81 |

Referring to Table 3, the photodiode according to Example 1 has improved photoelectric conversion efficiency compared to the photodiode according to the Comparative Example.

Evaluation IV

The dark current density of the photodiodes according to Examples 1 and 2 and the Comparative Example is evaluated.

A dark current is evaluated by using a current-voltage evaluation equipment (Keithley K4200 Parameter Analyzer) and divided by a unit pixel area (0.04 $cm^2$) to obtain dark current density, and the dark current density is evaluated from a current flowing when a reverse bias of −1 V is applied.

The results are shown in Table 4.

TABLE 4

| | Dark current density (A/cm$^2$, @ −1 V) |
|---|---|
| Example 1 | $8.0 \times 10^{-9}$ |
| Example 2 | $1.5 \times 10^{-9}$ |
| Comparative Example | $1.0 \times 10^{-7}$ |

Referring to Table 4, the photodiodes according to Examples 1 and 2 have improved dark current characteristics compared to the photodiode according to the Comparative Example.

While the inventive concepts have been described in connection with what is presently considered to be practical example embodiments, it is to be understood that the inventive concepts are not limited to such example embodiments. On the contrary, the inventive concepts are intended to cover various modifications and equivalent arrangements included within the spirit and scope of the appended claims.

What is claimed is:

1. A perovskite photodiode, comprising:

a first electrode and a second electrode, a perovskite photoelectric conversion layer between the first electrode and the second electrode, the perovskite photoelectric conversion layer including a Pb-free perovskite, and an auxiliary layer between the first electrode and the perovskite photoelectric conversion layer, the auxiliary layer including a compound represented by Chemical Formula 1:

[Chemical Formula 1]

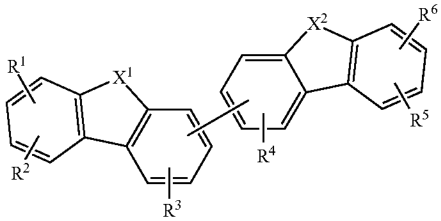

wherein, in Chemical Formula 1, $X^1$ and $X^2$ are different from each other and each is $CR^aR^b$, $SiR^cR^d$, or $NR^c$, $R^2$ to $R^5$ are each independently hydrogen, a substituted or unsubstituted C1 to C30 alkyl group, a substituted or unsubstituted C1 to C30 alkoxy group, a substituted or unsubstituted C6 to C20 aryl group, a substituted or unsubstituted C3 to C20 heterocyclic group, a halogen, a cyano group, —$NR^fR^g$, or any combination thereof, $R^a$ to $R^g$ are each independently hydrogen, a substituted or unsubstituted C1 to C30 alkyl group, a substituted or unsubstituted C6 to C20 aryl group, a substituted or unsubstituted C3 to C20 heterocyclic group, a halogen, a cyano group, or any combination thereof, $R^a$ and $R^b$ are each independently present or are combined with each other to form a first ring, $R^c$ and $R^d$ are each independently present or are combined with each other to form a second-ring, and ring, $R^f$ and $R^g$ are each independently present or are combined with each other to form a third ring, and $R^1$ and $R^6$ in Chemical Formula 1 are each —$NR^fR^g$, wherein $R^f$ and $R^g$ are each a substituted or unsubstituted C6 to C20 aryl group, and $R^f$ and $R^g$ are bonded to each other through a single bond, a substituted or unsubstituted C1 to C5 alkylene group, a substituted or unsubstituted C2 to C5 alkenylene group, a substituted or unsubstituted C6 to C20 arylene group, O, S, Se, Te, $CR^hR^i$, $SiR^jR^k$, or $GeR^lR^m$ to form a separate ring, wherein $R^h$ to $R^m$ are each independently hydrogen, a substituted or unsubstituted C1 to C30 alkyl group, a substituted or unsubstituted C6 to C20 aryl group, a substituted or unsubstituted C3 to C20 heterocyclic group, a halogen, a cyano group, or any combination thereof.

2. The perovskite photodiode of claim 1, wherein the Pb-free perovskite comprises an organic-inorganic tin halide perovskite represented by Chemical Formula 2:

[Chemical Formula 2]

$$FA_{1-a}X_aSnI_3$$

wherein, in Chemical Formula 2,

FA is formamidinium,

X is ethylene diammonium, methyl ammonium, $Cs^+$, substituted or unsubstituted C6 to C12 aromatic alkyl ammonium, substituted or unsubstituted C1 to C10 aliphatic ammonium, or any combination thereof, and $$0 \leq a \leq 1.$$

3. The perovskite photodiode of claim 1, wherein $X^1$ in Chemical Formula 1 is $CR^aR^b$ or $SiR^cR^d$, wherein $R^a$ to $R^d$ are each independently hydrogen, a substituted or unsubstituted C1 to C30 alkyl group or a substituted or unsubstituted C6 to C20 aryl group, and $X^2$ in Chemical Formula 1 is $NR^e$, wherein $R^e$ is a substituted or unsubstituted C6 to C20 aryl group.

4. The perovskite photodiode of claim 1, wherein the compound is represented by Chemical Formula 1A:

[Chemical Formula 1A]

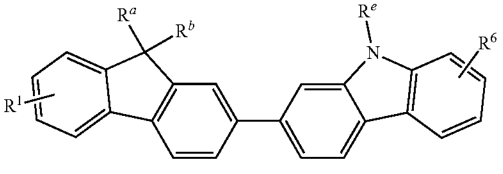

wherein, in Chemical Formula 1A, $R^a$ and $R^b$ are each independently hydrogen, a substituted or unsubstituted C1 to C30 alkyl group or a substituted or unsubstituted C6 to C20 aryl group, $R^e$ is a substituted or unsubstituted C6 to C20 aryl group, and $R^1$ and $R^6$ are each one of a plurality of groups listed in Group 1,

[Group 1]

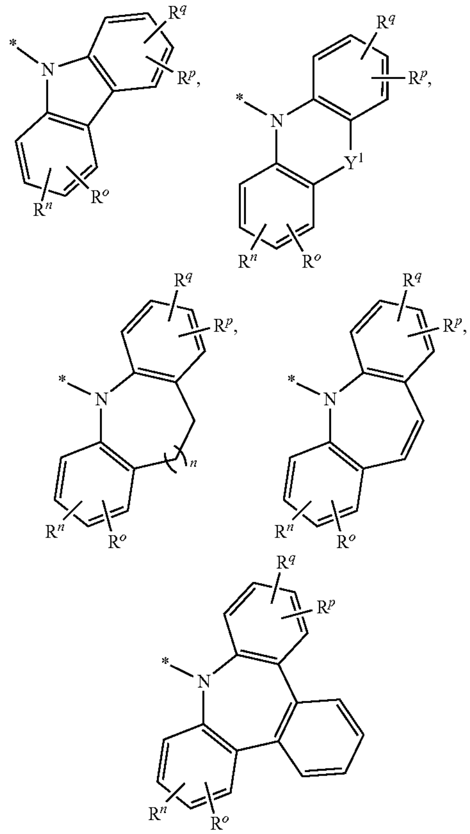

wherein, in Group 1, $Y^1$ is O, S, Se, Te, $CR^hR^i$, $SiR^jR^k$, or $GeR^lR^m$, $R^h$ to $R^q$ are each independently hydrogen, a substituted or unsubstituted C1 to C30 alkyl group, a substituted or unsubstituted C6 to C20 aryl group, a substituted or unsubstituted C3 to C20 heterocyclic group, a halogen, a cyano group, or any combination thereof, n is an integer from 0 to 2, and

* is a linking point with Chemical Formula 1A.

5. An image sensor comprising the perovskite photodiode of claim 1.

6. An image sensor, comprising:

a substrate, a first perovskite photodiode on the substrate, and a wavelength selective filter layer overlapped with the first perovskite photodiode and comprising a plurality of wavelength selective filters, wherein the first perovskite photodiode includes a first electrode and a second electrode, a first perovskite photoelectric conversion layer between the first electrode and the second electrode, the first perovskite photoelectric conversion layer including a first Pb-free perovskite, and a first auxiliary layer between the first electrode and the first perovskite photoelectric conversion layer, the first auxiliary layer including a compound represented by Chemical Formula 1:

[Chemical Formula 1]

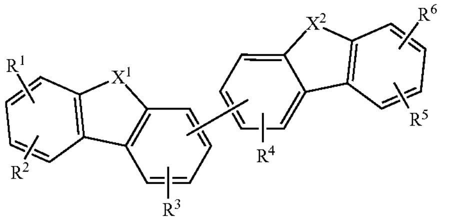

wherein, in Chemical Formula 1, $X^1$ and $X^2$ are different from each other and each is $CR^aR^b$, $SiR^cR^d$, or $NR^c$, $R^2$ to $R^5$ are each independently hydrogen, a substituted or unsubstituted C1 to C30 alkyl group, a substituted or unsubstituted C1 to C30 alkoxy group, a substituted or unsubstituted C6 to C20 aryl group, a substituted or unsubstituted C3 to C20 heterocyclic group, a halogen, a cyano group, —$NR^fR^g$, or any combination thereof, $R^a$ to $R^g$ are each independently hydrogen, a substituted or unsubstituted C1 to C30 alkyl group, a substituted or unsubstituted C6 to C20 aryl group, a substituted or unsubstituted C3 to C20 heterocyclic group, a halogen, a cyano group, or any combination thereof, $R^a$ and $R^b$ are each independently present or are combined with each other to form a first ring, $R^c$ and $R^d$ are each independently present or are combined with each other to form a second ring, $R^f$ and $R^g$ are each independently present or are combined with each other to form a third ring, and $R^1$ and $R^6$ in Chemical Formula 1 are each —$NR^fR^g$, wherein $R^f$ and $R^g$ are each a substituted or unsubstituted C6 to C20 aryl group, and $R^f$ and $R^g$ are bonded to each other through a single bond, a substituted or unsubstituted C1 to C5 alkylene group, a substituted or unsubstituted C2 to C5 alkenylene group, a substituted or unsubstituted C6 to C20 arylene group, O, S, Se, Te, $CR^hR^i$, $SiR^jR^k$ or $GeR^lR^m$ to form a separate ring, wherein $R^h$ to $R^m$ are each independently hydrogen, a substituted or unsubstituted C1 to C30 alkyl group, a substituted or unsubstituted C6 to C20 aryl group, a substituted or unsubstituted C3 to C20 heterocyclic group, a halogen, a cyano group, or any combination thereof.

7. The image sensor of claim 6, wherein the first Pb-free perovskite comprises an organic-inorganic tin halide perovskite represented by Chemical Formula 2:

[Chemical Formula 2]

$$FA_{1-a}X_aSnI_3$$

wherein, in Chemical Formula 2,

FA is formamidinium,

X is ethylene diammonium, methyl ammonium, $Cs^+$, substituted or unsubstituted C6 to C12 aromatic alkyl ammonium, substituted or unsubstituted C1 to C10 aliphatic ammonium, or any combination thereof, and $$0 \leq a \leq 1.$$

8. The image sensor of claim 6, wherein $X^1$ in Chemical Formula 1 is $CR^aR^b$ or $SiR^cR^d$, wherein $R^a$ to $R^d$ are each independently hydrogen, a substituted or unsubstituted C1 to C30 alkyl group or a substituted or unsubstituted C6 to C20 aryl group, and $X^2$ in Chemical Formula 1 is $NR^e$, wherein $R^e$ is a substituted or unsubstituted C6 to C20 aryl group.

9. The image sensor of claim 6, wherein the compound is represented by Chemical Formula 1A:

[Chemical Formula 1A]

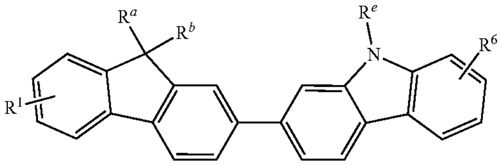

wherein, in Chemical Formula 1A, $R^a$ and $R^b$ are each independently hydrogen, a substituted or unsubstituted C1 to C30 alkyl group or a substituted or unsubstituted C6 to C20 aryl group, $R^e$ is a substituted or unsubstituted C6 to C20 aryl group, and $R^1$ and $R^6$ are each one of a plurality of groups listed in Group 1,

[Group 1]

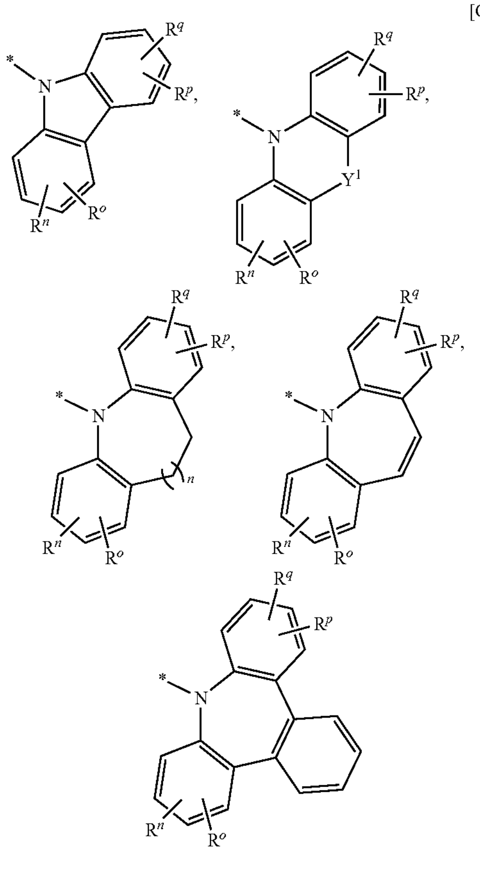

wherein, in Group 1, $Y^1$ is O, S, Se, Te, $CR^hR^i$, $SiR^jR^k$, or $GeR^lR^m$, $R^h$ to $R^q$ are each independently hydrogen, a substituted or unsubstituted C1 to C30 alkyl group, a substituted or unsubstituted C6 to C20 aryl group, a substituted or unsubstituted C3 to C20 heterocyclic group, a halogen, a cyano group, or any combination thereof, n is an integer from 0 to 2, and

* is a linking point with Chemical Formula 1A.

10. The image sensor of claim 6, wherein the plurality of wavelength selective filters include at least two of a blue filter, a green filter, a red filter, a cyan filter, a yellow filter, or a magenta filter.

11. The image sensor of claim 10, wherein the plurality of wavelength selective filters further comprise an infrared filter.

12. The image sensor of claim 6, wherein the first perovskite photodiode comprises a blue perovskite photodiode configured to selectively sense light in a blue wavelength spectrum, a green perovskite photodiode configured to selectively sense light in a green wavelength spectrum, and a red perovskite photodiode configured to selectively sense light in a red wavelength spectrum, wherein the blue perovskite photodiode, the green perovskite photodiode, and the red perovskite photodiode are arranged along an in-plane direction of the substrate, wherein the wavelength selective filter layer includes a first wavelength selective filter overlapped with the blue perovskite photodiode and selected from a blue filter, a cyan filter, and a magenta filter, a second wavelength selective filter overlapped with the green perovskite photodiode and selected from a green filter, a cyan filter, and a yellow filter, and a third wavelength selective filter overlapped with the red perovskite photodiode and selected from a red filter, a yellow filter, and a magenta filter, and wherein the first wavelength selective filter, the second wavelength selective filter and the third wavelength selective filter are different from each other.

13. The image sensor of claim 12, wherein the blue perovskite photodiode, the green perovskite photodiode, and the red perovskite photodiode comprise the first perovskite photoelectric conversion layer comprising the first Pb-free perovskite in common, and a cut-off wavelength of an absorption spectrum of the first Pb-free perovskite belongs to more than about 650 nm and less than about 750 nm.

14. The image sensor of claim 12, wherein the first perovskite photodiode further comprises an infrared perovskite photodiode configured to selectively sense light of an infrared wavelength spectrum, the infrared perovskite photodiode is arranged in parallel with the blue perovskite photodiode, the green perovskite photodiode, and the red perovskite photodiode along the in-plane direction of the substrate, and the wavelength selective filter layer further comprises an infrared filter arranged in parallel with the first wavelength selective filter, the second wavelength selective filter, and the third wavelength selective filter.

15. The image sensor of claim 14, wherein the blue perovskite photodiode, the green perovskite photodiode, the red perovskite photodiode, and the infrared perovskite photodiode include separate, respective portions of the first perovskite photoelectric conversion layer including the first Pb-free perovskite, and a cut-off wavelength of an absorption spectrum of the first Pb-free perovskite belongs to about 800 nm to about 3000 nm.

16. The image sensor of claim 6, further comprising an infrared photodiode stacked with the first perovskite photodiode.

17. The image sensor of claim 16, wherein
the substrate is a CMOS substrate, and
the infrared photodiode is a silicon photodiode integrated in the CMOS substrate.

18. The image sensor of claim 16, wherein
the infrared photodiode is a second perovskite photodiode stacked with the first perovskite photodiode on the substrate, and
the second perovskite photodiode comprises
a third electrode and a fourth electrode,
a second perovskite photoelectric conversion layer between the third electrode and the fourth electrode, the second perovskite photoelectric conversion layer including a second Pb-free perovskite having a cut-off wavelength belonging to about 800 nm to about 3000 nm, and
a second auxiliary layer between the third electrode and the second perovskite photoelectric conversion layer and comprising the compound represented by the Chemical Formula 1.

19. An electronic device comprising the image sensor of claim 6.

* * * * *